(12) United States Patent
Murahari et al.

(10) Patent No.: US 10,855,067 B2
(45) Date of Patent: Dec. 1, 2020

(54) ELECTRICAL UNITS WITH ONBOARD ELECTRONIC MONITORING AND RELATED METHODS

(71) Applicant: Eaton Intelligent Power Limited, Dublin (IE)

(72) Inventors: Saivaraprasad Murahari, Peachtree City, GA (US); Lili Du, Shanghai (CN); Jianguo Chen, Shanghai (CN)

(73) Assignee: Eaton Intelligent Power Limited, Dublin (IE)

( * ) Notice: Subject to any disclaimer, the term of this patent is extended or adjusted under 35 U.S.C. 154(b) by 423 days.

(21) Appl. No.: 15/560,537

(22) PCT Filed: Apr. 1, 2015

(86) PCT No.: PCT/CN2015/075660
§ 371 (c)(1),
(2) Date: Sep. 22, 2017

(87) PCT Pub. No.: WO2016/154961
PCT Pub. Date: Oct. 6, 2016

(65) Prior Publication Data
US 2018/0115146 A1    Apr. 26, 2018

(51) Int. Cl.
*H02H 3/04* (2006.01)
*H01H 83/02* (2006.01)
(Continued)

(52) U.S. Cl.
CPC ............. *H02H 3/04* (2013.01); *H01H 83/02* (2013.01); *H01H 83/20* (2013.01);
(Continued)

(58) Field of Classification Search
CPC ........ H02H 3/04; H02H 1/0015; H01H 83/02; H01H 83/20; H01H 2083/201;
(Continued)

(56) References Cited

U.S. PATENT DOCUMENTS 5,317,202 A  *  5/1994  Waizman ............... H03K 5/133
                                                           327/156
6,329,851 B1 * 12/2001  Murphy  ............... H03K 17/223
                                                           327/143
(Continued)

FOREIGN PATENT DOCUMENTS

CN      200947507 Y     9/2007
CN      201210559 Y     3/2009
(Continued)

OTHER PUBLICATIONS

International Search Report and the Written Opinion of the International Searching Authority corresponding to International Patent Application No. PCT/CN2015/075660 (12 pages) (dated Dec. 31, 2015).

*Primary Examiner* — Pete T Lee
(74) *Attorney, Agent, or Firm* — Myers Bigel, P.A.

(57) ABSTRACT

AFCI and/or GFCI units (10) with onboard trip monitoring and/or wiring error monitoring circuit (100) with an opto-isolator (50) and a controller (60) in electrical communication with the opto-isolator (50). The controller (60) monitors the opto-isolator (50) to identify a TRIP or RESET state of the circuit (100) such as one associated with a receptacle and/or a wiring error of the unit (10), e.g., receptacle.

27 Claims, 20 Drawing Sheets

(51) Int. Cl.
*H02H 1/00* (2006.01)
*H01H 83/20* (2006.01)
*H01R 13/655* (2006.01)
*H01R 13/713* (2006.01)
*H01R 24/22* (2011.01)
*H05K 1/18* (2006.01)
*H01R 103/00* (2006.01)
*H03K 17/78* (2006.01)

(52) U.S. Cl.
CPC ....... *H01R 13/655* (2013.01); *H01R 13/7135* (2013.01); *H01R 24/22* (2013.01); *H02H 1/0015* (2013.01); *H05K 1/18* (2013.01); *H01H 2083/201* (2013.01); *H01H 2235/01* (2013.01); *H01H 2239/022* (2013.01); *H01R 2103/00* (2013.01); *H03K 17/78* (2013.01); *H05K 2201/10106* (2013.01); *H05K 2201/10121* (2013.01)

(58) Field of Classification Search
CPC ......... H01H 2235/01; H01H 2239/022; H01R 13/655; H01R 13/7135; H01R 24/22; H01R 2103/00; H05K 1/18; H05K 2201/10106; H05K 2201/10121; H03K 17/78

See application file for complete search history.

(56) References Cited

U.S. PATENT DOCUMENTS

| | | |
|---|---|---|
| 2004/0223279 A1 | 11/2004 | Bonilla et al. |
| 2009/0161270 A1 | 6/2009 | Beatty, Jr. et al. |
| 2011/0115529 A1* | 5/2011 | Jansson ................ H03K 5/2481 327/90 |
| 2012/0069476 A1 | 3/2012 | Fabian |
| 2012/0292991 A1 | 11/2012 | Dodal et al. |
| 2013/0241678 A1* | 9/2013 | Bonasia ................ H01H 83/04 335/18 |

FOREIGN PATENT DOCUMENTS

| | | |
|---|---|---|
| CN | 101540249 A | 9/2009 |
| CN | 101950945 A | 1/2011 |
| CN | 203521795 U | 4/2014 |

* cited by examiner

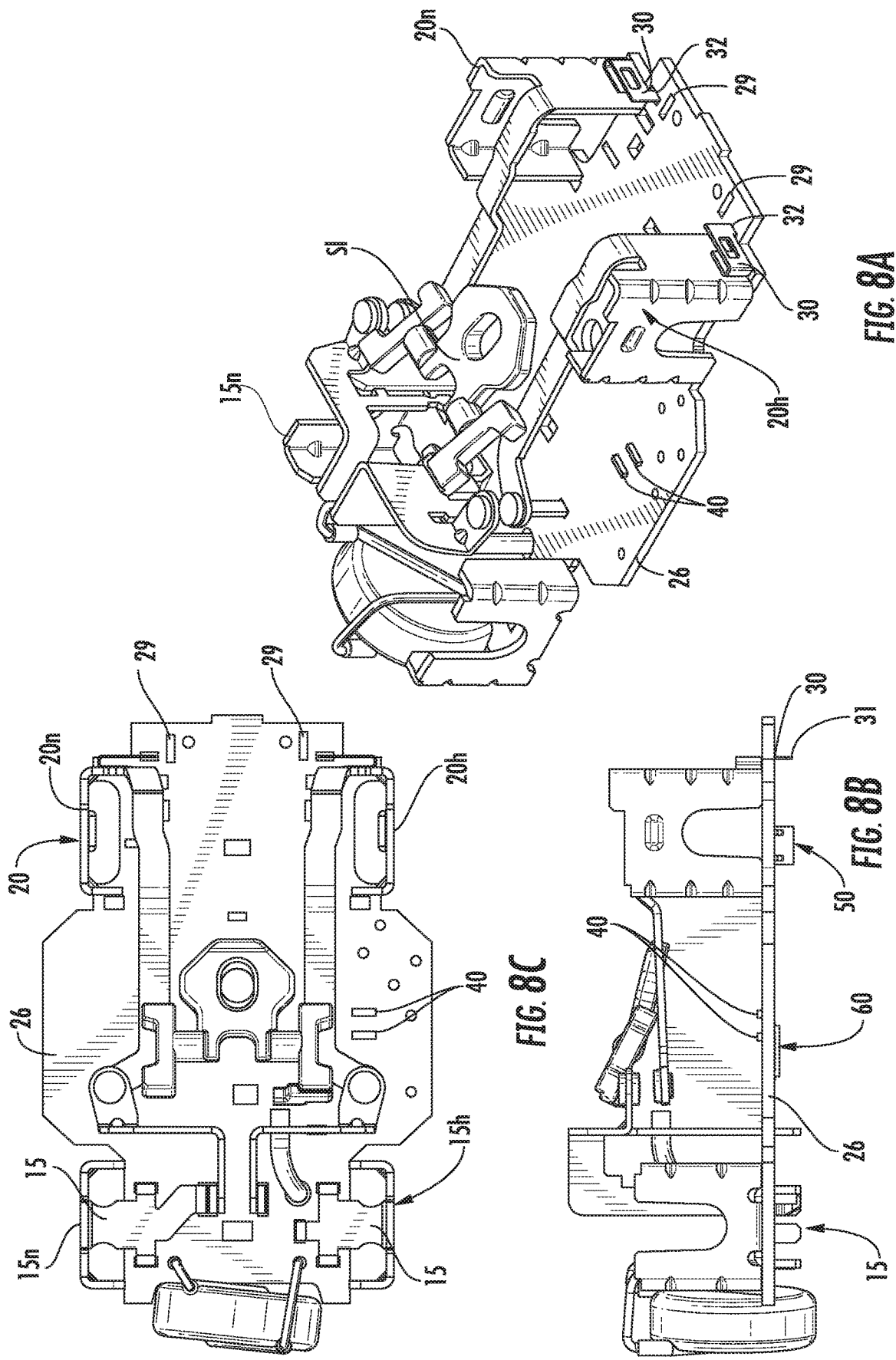

ELECTRICAL UNITS WITH ONBOARD ELECTRONIC MONITORING AND RELATED METHODS

FIELD OF THE INVENTION

The present invention relates to electrical units such as receptacles for branch circuits such as Arc Fault Circuit Interrupter (AFCI) or Ground Fault Circuit Interrupter (GFCI) units.

BACKGROUND OF THE INVENTION

AFCI and GFCI receptacles are among a variety of overcurrent protection devices used for circuit protection and isolation. A GFCI is a device that shuts off an electric circuit when it detects that current is flowing along an unintended path to reduce the risk of electric shock. The GFCI can be manually reset by pushing a reset button. There is also a test button that can be used to verify that the GFCI works. An AFCI is a duplex or single receptacle or circuit breaker designed to help prevent fires by detecting an unintended electrical arc and disconnecting the power before the arc starts a fire.

SUMMARY OF EMBODIMENTS OF THE INVENTION

Embodiments of the present invention are directed to outlet branch circuit (OBC) AFCI or GFCI units which can electrically monitor for electrical potential on load terminals to thereby provide positive feedback regarding certain operational states such as TRIP/RESET status and/or wiring errors of a unit which can optionally include at least one receptacle.

Embodiments of the invention are directed to Arc Fault Circuit Interrupter (AFCI) receptacles and/or Ground Fault Circuit Interrupter (GFCI) units with an onboard microcontroller and opto-isolator that is in electrical communication with load neutral and load hot of load terminals and monitors the load terminals to generate RESET and TRIP states.

Embodiments of the invention are directed to units such as Arc Fault Circuit Interrupter (AFCI) receptacle units and/or Ground Fault Circuit Interrupter (GFCI) units. The units include: a unit housing with a ground strap held by the unit housing, the receptacle having line and load sides, the load side having hot and neutral branches; a circuit interruption device in the receptacle unit housing configured to detect a fault and to interrupt power to the load side; an opto-isolator in electrical communication with the hot and neutral load branches; and a controller in electrical communication with the opto-isolator in the unit housing. The controller monitors the opto-isolator to identify a TRIP or RESET state of the receptacle.

The unit can include at least one receptacle and the ground strap can be coupled to the receptacle. The receptacle can have the line and load sides.

The unit can include a printed circuit board (PCB) that holds the controller and the opto-isolator and a plurality of light emitting diodes in communication with the controller; a first load contact member that connects the load side hot branch to the PCB; and a second spaced apart load contact member that connects the load side neutral branch to the PCB.

The unit can include isolation apertures extending through the PCB residing between adjacent pins of the opto-isolator and the load contact members.

The first and second load contact members can have a leg that extends under a spring body. The spring body can have first and second sides, one side of the spring body being planar and the other being curvilinear, prior to assembly.

The unit can include a housing in the unit housing with first and second flat panels, each having an outer perimeter with a notch. Each load contact member can reside in a respective notch over the PCB with the first side of the spring body on one side of a corresponding flat panel and with the second side of the spring body on an opposing side.

Other embodiments are directed to Arc Fault Circuit Interrupter (AFCI) units and/or Ground Fault Circuit Interrupter (GFCI) units that include: a unit housing with a ground strap held by the unit housing, the unit housing having line and load sides, the load side having hot and neutral branches; a circuit interruption device in the receptacle unit housing configured to detect a fault and to interrupt power to the load side; an opto-isolator in electrical communication with the hot load branch and the ground strap; and a controller in electrical communication with the opto-isolator in the unit housing. The controller monitors the opto-isolator to identify a wiring error associated with the receptacle.

The unit can include: a printed circuit board (PCB) that holds the controller and the opto-isolator and a plurality of light emitting diodes in communication with the controller; a load contact member that connects the load side hot branch to the PCB; and a ground strap contact member residing under the ground strap and in electrical communication with a solenoid frame over the PCB. The solenoid frame can include a tab that extends through the PCB to provide a ground strap input to the opto-isolator.

The unit can include isolation apertures extending through the PCB residing between adjacent pins of the opto-isolator and the load contact member.

The unit can include a printed circuit board (PCB) that holds the controller and the opto-isolator and at least one light emitting diode in communication with the controller; a load contact member that connects the load side hot branch to the PCB; and a spring ground strap contact member residing under the ground strap and in electrical communication with a solenoid frame over the PCB. The solenoid frame can include a tab that extends through the PCB to provide a ground strap input to the opto-isolator.

The load contact member can have a leg that extends under a spring body. The spring body can have first and second sides, one side of the spring body being planar and the other being curvilinear, prior to assembly.

The unit can include a housing inside the receptacle unit housing with a flat panel having an outer perimeter with a notch. The load contact member can reside in the notch over the PCB with the first side of the spring body on one side of the flat panel and with the second side of the spring body on an opposing side.

Still other embodiments are directed to Arc Fault Circuit Interrupter (AFCI) units and/or Ground Fault Circuit Interrupter (GFCI) units that include: a receptacle unit housing with a ground strap coupled to a receptacle held by the unit housing, the unit housing having line and load sides, the load side having hot and neutral branches; a circuit interruption device in the receptacle unit housing configured to detect a fault and to interrupt power to the load side; an opto-isolator in electrical communication with the hot and neutral load branches and the ground strap; and a controller in electrical communication with the opto-isolator in the unit housing. The controller monitors the opto-isolator to identify (a) a wiring error associated with the receptacle and (b) a TRIP or RESET state of the receptacle The unit can include a printed circuit board (PCB) that holds the controller and the opto-isolator and at least one light emitting diode in communication with the controller; a first load contact member that connects the load side hot branch to the PCB; and a second spaced apart load contact member that connects the load side neutral branch to the PCB.

The unit can include isolation apertures extending through the PCB residing between adjacent pins of the opto-isolator and the load contact members.

The first and second load contact members can have a leg that extends under a spring body. The spring body can have first and second sides, one side of the spring body being planar and the other being curvilinear, prior to assembly The unit can include a housing in the receptacle unit housing with first and second flat panels, each can have an outer perimeter with a notch. Each load contact member can reside in a respective notch over the PCB with the first side of the spring body on one side of a corresponding flat panel and with the second side of the spring body on an opposing side.

The unit can include: a printed circuit board (PCB) that holds the controller and the opto-isolator and a plurality of light emitting diodes in communication with the controller; a first load contact member that connects the load side hot branch to the PCB; a second load contact member that connects the load side neutral branch to the PCB; and a ground strap contact member residing under the ground strap and in electrical communication with a conductive solenoid frame over the PCB, wherein the solenoid frame comprises a conductive tab that extends through the PCB to provide a ground strap input to the opto-isolator. The ground strap contact member may be configured as a conductive spring ground strap contact member.

The unit can include at least one receptacle with the ground strap coupled to the receptacle. The receptacle can have the line and load sides.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIG. 8A is a side perspective view of a sub-assembly of a receptacle in a status "OFF" or "TRIP" position according to embodiments of the present invention.

FIG. 8B is a side view of the sub-assembly shown in FIG. 8A.

FIG. 8C is a top view of the sub-assembly shown in FIG. 8A.

DETAILED DESCRIPTION OF EMBODIMENTS OF THE INVENTION

Figure 1:
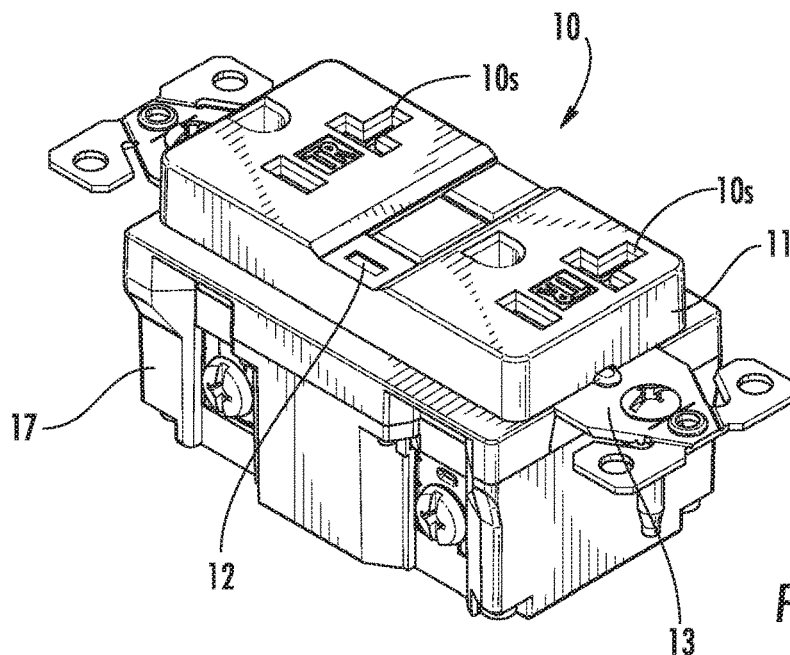
FIG. 1 is a side perspective view of an exemplary receptacle according to embodiments of the present invention.

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'"). Abbreviated versions of the word "Figure" such as "FIG." and "Fig." are used interchangeably in the application.

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

The term "spring contact" refers to an electrical contact that has sufficient elasticity to be able to resiliently, if not elastically, deform to electrically and mechanically contact a target feature or object.

The term "controller" is used broadly and includes control circuitry in a receptacle, typically held totally onboard a wall-mounted AFCI/GFCI unit, such as an electrical-plug in receptacle, and can include one or more microcontrollers, microprocessors, programmable logic controllers (PLCs), digital signal processors (DSPs), or Integrated Circuits (ICs). The ICs can optionally include at least one Application-Specific Integrated Circuits (ASICs).

The term "opto-isolator" (also sometimes called an opto-coupler, photocoupler, or optical isolator), refers to an electrical component or components that transfer electrical signals between two isolated circuits by using light. Conventional opto-isolators include a light emitting diode (LED) and a photo-detector such as a photosensitive silicon diode, transistor, Darlington pair, or silicon controlled rectifier (SCR). An opto-isolator can include other circuit components such as an amplifier. Opto-isolators can prevent high voltages from affecting the system receiving the signal. The opto-isolator can be provided as an integrated IC package but may be provided as separate components. More than one opto-isolator may be included in an integrated package. The opto-isolator can have any suitable input/output circuit paths, typically a 4 pin or 6 pin package.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 2:
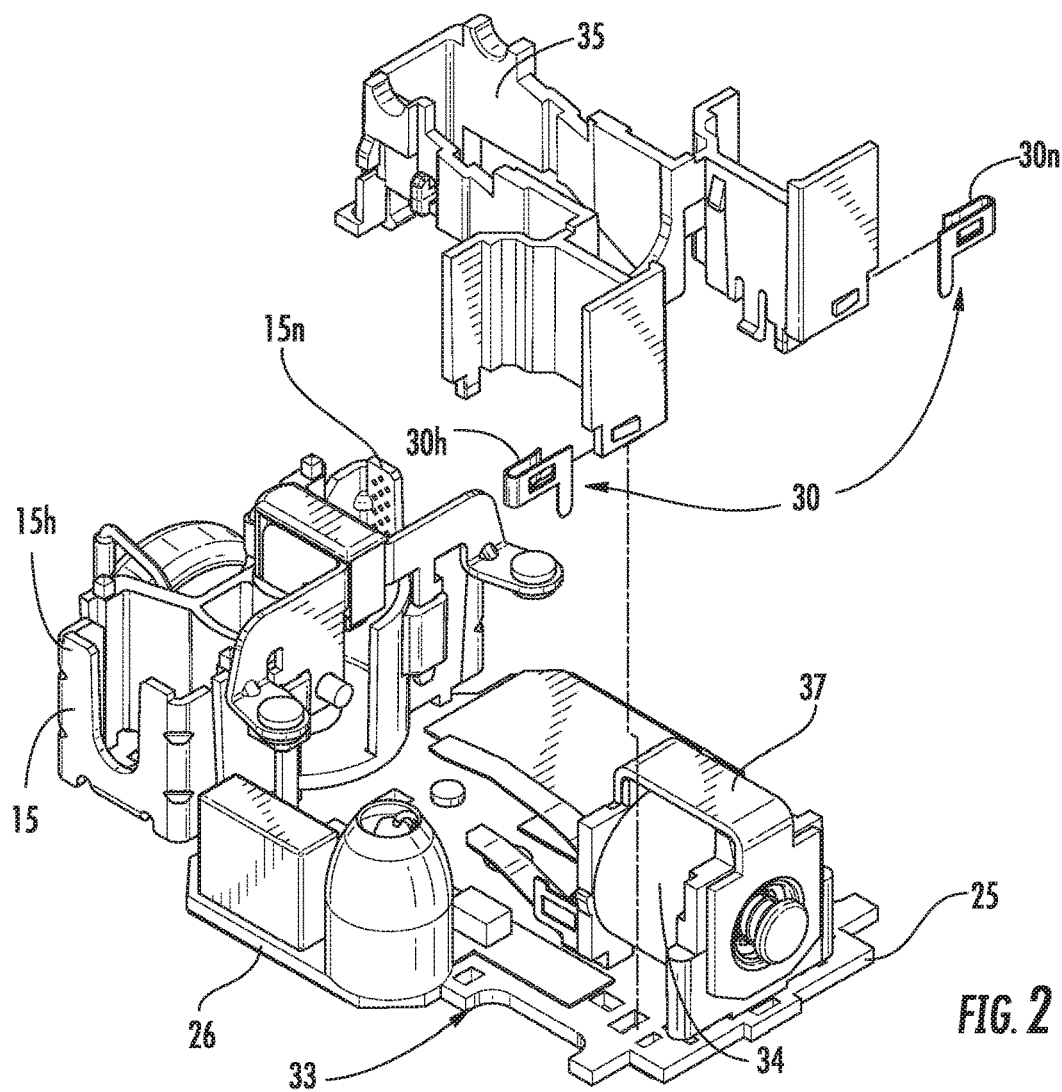
FIG. 2 is a partial exploded view of components of the receptacle shown in FIG. 1 according to embodiments of the present invention.
Figure 3:
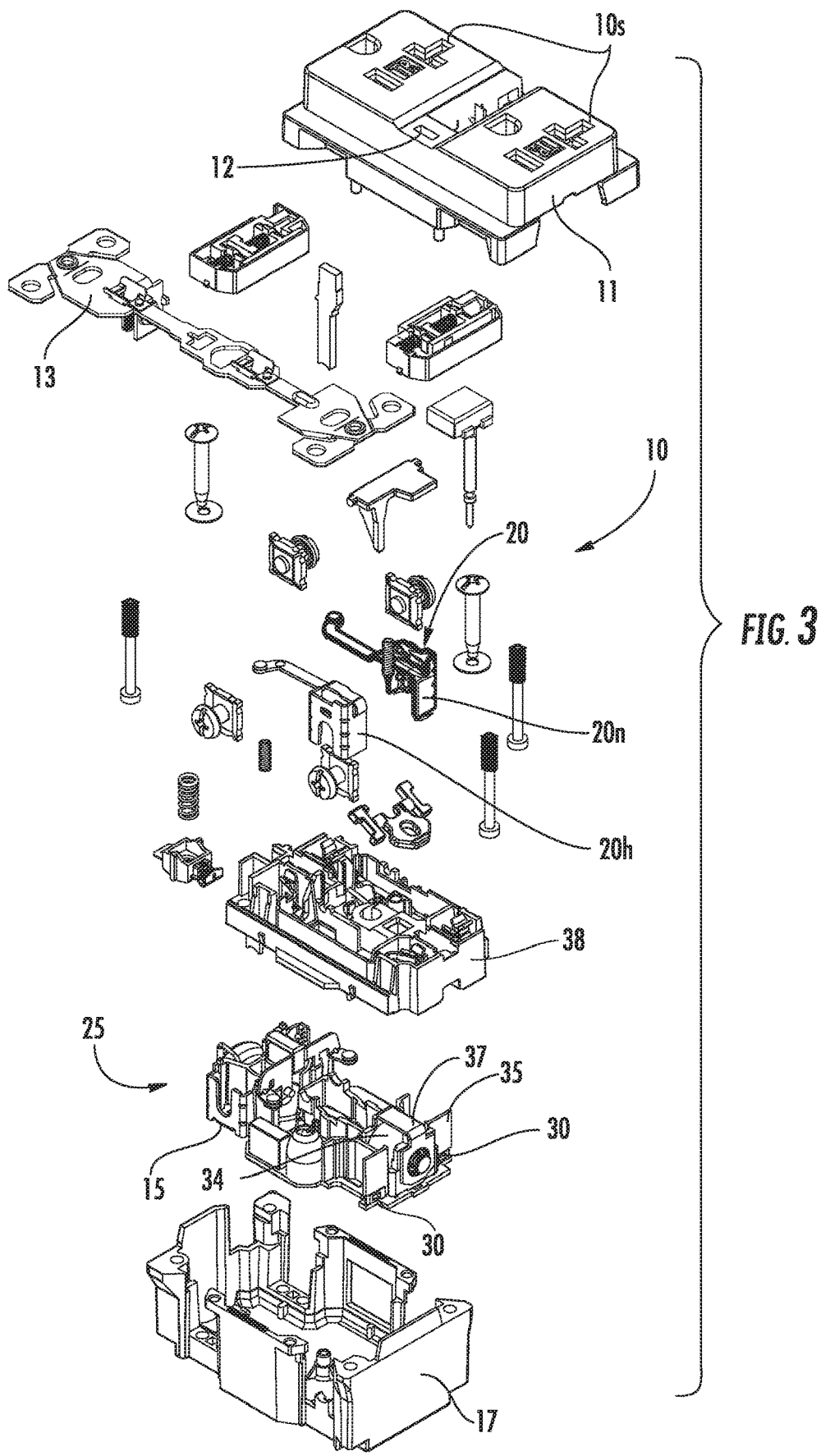
FIG. 3 is an exploded view of the receptacle shown in FIG. 1 according to embodiments of the present invention.

Turning now to the figures, FIGS. 1-3 illustrate an exemplary unit 10. The unit 10 can includes line terminals 15, load terminals 20 (FIG. 3), a solenoid assembly 33 and a printed circuit board (PCB) assembly 25. The line terminals 15 include opposing hot and neutral branches and/or terminals 15h, 15n, respectively. The load terminals 20 also include hot and neutral branches, e.g., terminals 20h, 20n, respectively. Each hot terminal 15h, 20h is shown on a right side in the figures, but this orientation can be reversed.

The solenoid assembly 33 can include a solenoid 34, a solenoid frame 37 and a solenoid housing 35, which may all held on the PCB assembly 25. The solenoid housing 37 can hold load terminals 20h, 20n (FIG. 3). The unit 10 also typically includes a middle housing 38 (FIG. 3). The PCB assembly 25 can include at least one printed circuit board (PCB) 26. The term "printed circuit board" is used broadly and can include flex circuits or other substrates in a single or multiple layers or components that provide defined electrical paths. As shown in FIGS. 1-3, for example, the at least one PCB 26 is a single PCB that has a perimeter shape that fits in the casing 17 under the receptacle outlet cover 11. The cover 11 can include dual plug-in receptacle sockets 10s. The receptacle unit 10 can include a ground strap 13 that resides between the solenoid housing 35 and the outlet cover 11.

The unit 10 can include at least one window 12 that provides a visual indication light output such as from one or more light emitting diodes (LEDs) 40 (FIGS. 6, 8A, 9A) or other visual light indicators as will be discussed below.

In some embodiments, the visual indication light 40 can include two different LEDs (FIGS. 8A, 9A) aligned with the window 12 for providing at least two different defined colors, e.g., "red" for ground fault, "TRIP" or "RESET" and green for no TRIP or no ground fault, for example. Light guides or fiber optic fibers may also be used to direct the visual light output to the at least one window 12 (not shown). A respective load terminal 20 can be in communication with a load contact 30. The load hot contact 30h connects to the load hot branch and/or terminal 20h. The load neutral contact 30n connects to the load neutral branch and/or terminal 30n. The load contacts 30 can be spring contacts as will be discussed further below. The unit housing holds a circuit interruption device that is configured to detect a fault and to interrupt power to the load side.

Figure 4:
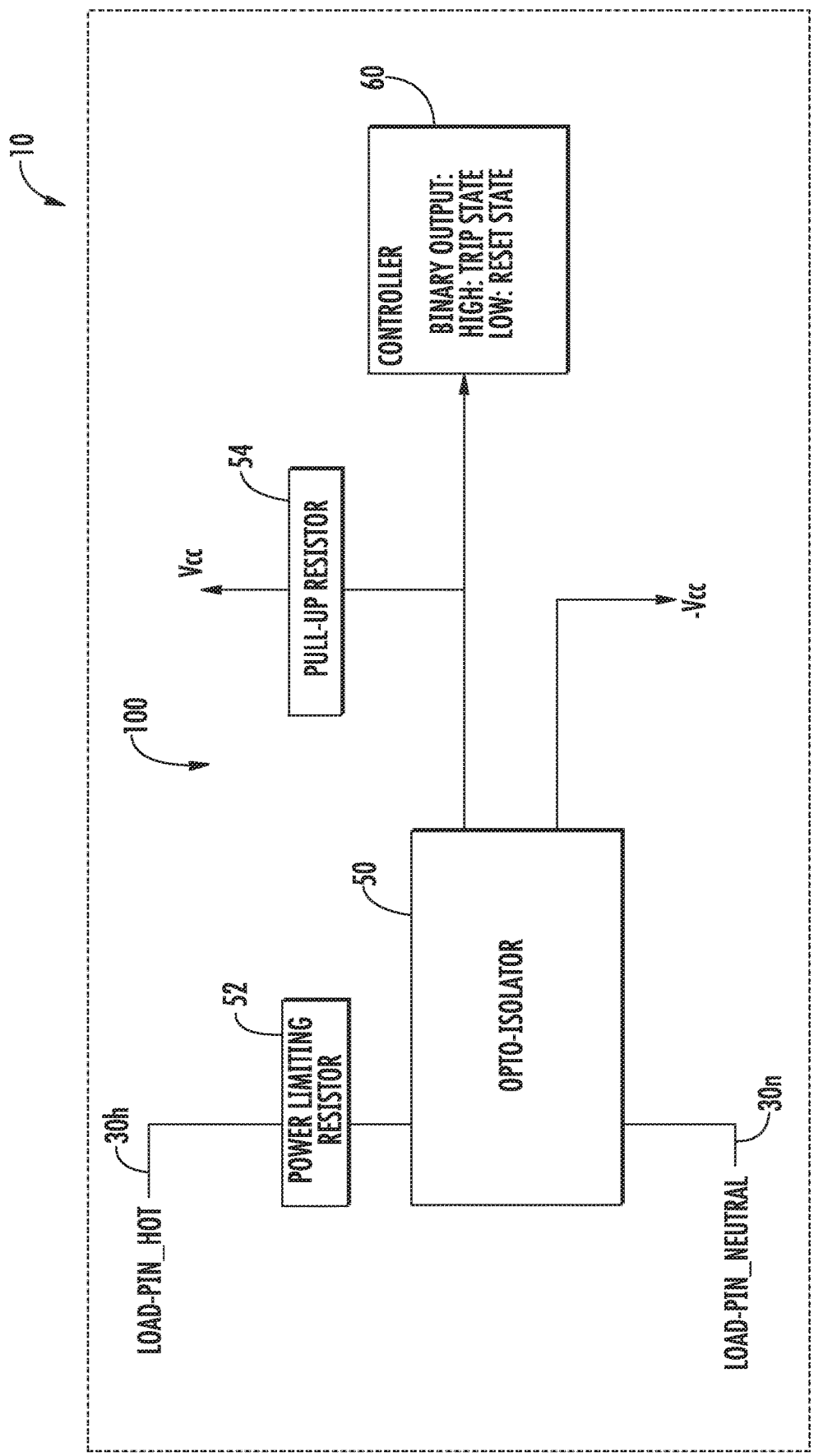
FIG. 4 is a schematic illustration of an exemplary onboard trip monitoring circuit for receptacles according to embodiments of the present invention.
Figure 5:
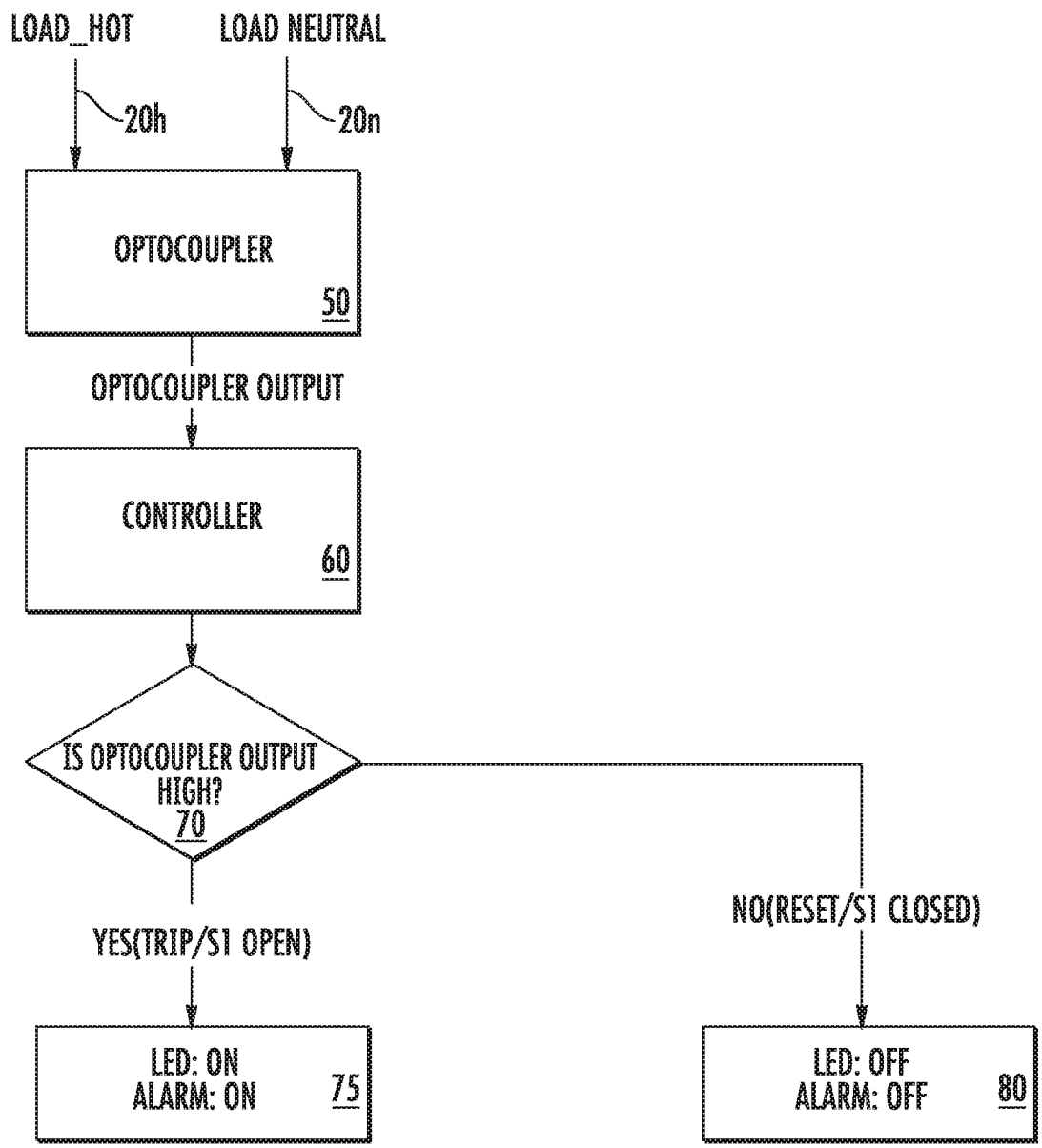
FIG. 5 is a flow chart of a trip monitoring circuit of a receptacle according to embodiments of the present invention.
Figure 6:
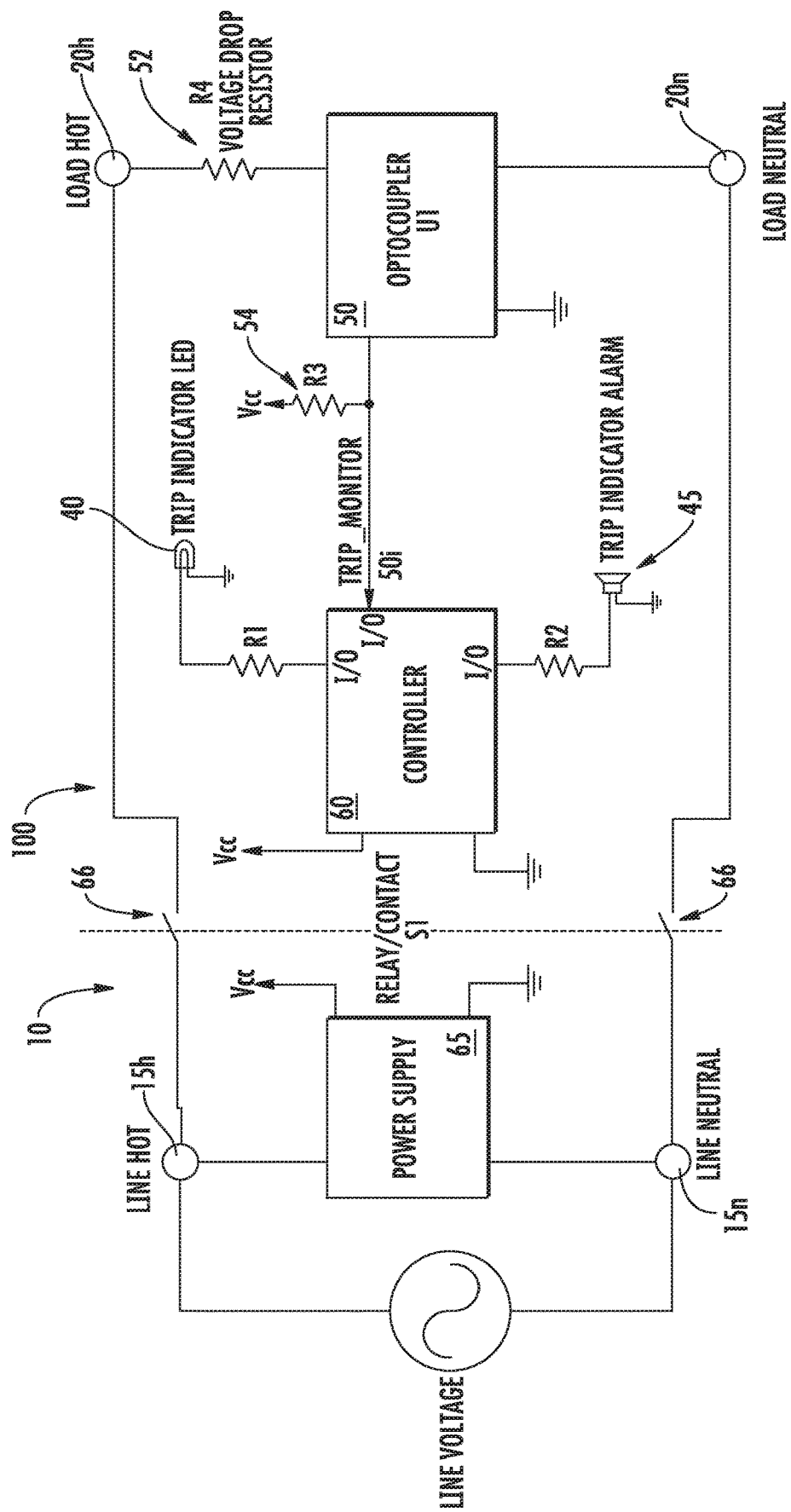
FIG. 6 is a schematic illustration of an exemplary onboard trip monitoring circuit for receptacles according to embodiments of the present invention.

Referring to FIGS. 4-6, the receptacle unit 10 can include an onboard trip monitoring circuit 100 comprising at least one opto-isolator 50 and at least one micro-controller 60 that electronically monitors for potential on hot and neutral load branches and/or terminals 20h, 20n. The at least one micro-controller 60 and opto-isolator 50 can electronically evaluate a voltage on load terminals 20 via load contacts 30 in communication with the PCB 26 to determine TRIP/RESET status of the AFCI or GFCI circuit and direct the light output LED 40 (FIG. 6) to show the appropriate light output and/or for the receptacle unit 10 to generate an audible alarm output 45 (FIG. 6). The monitoring circuit 100 can maintain electrical isolation between measured load voltage and other electronics.

Figure 20:
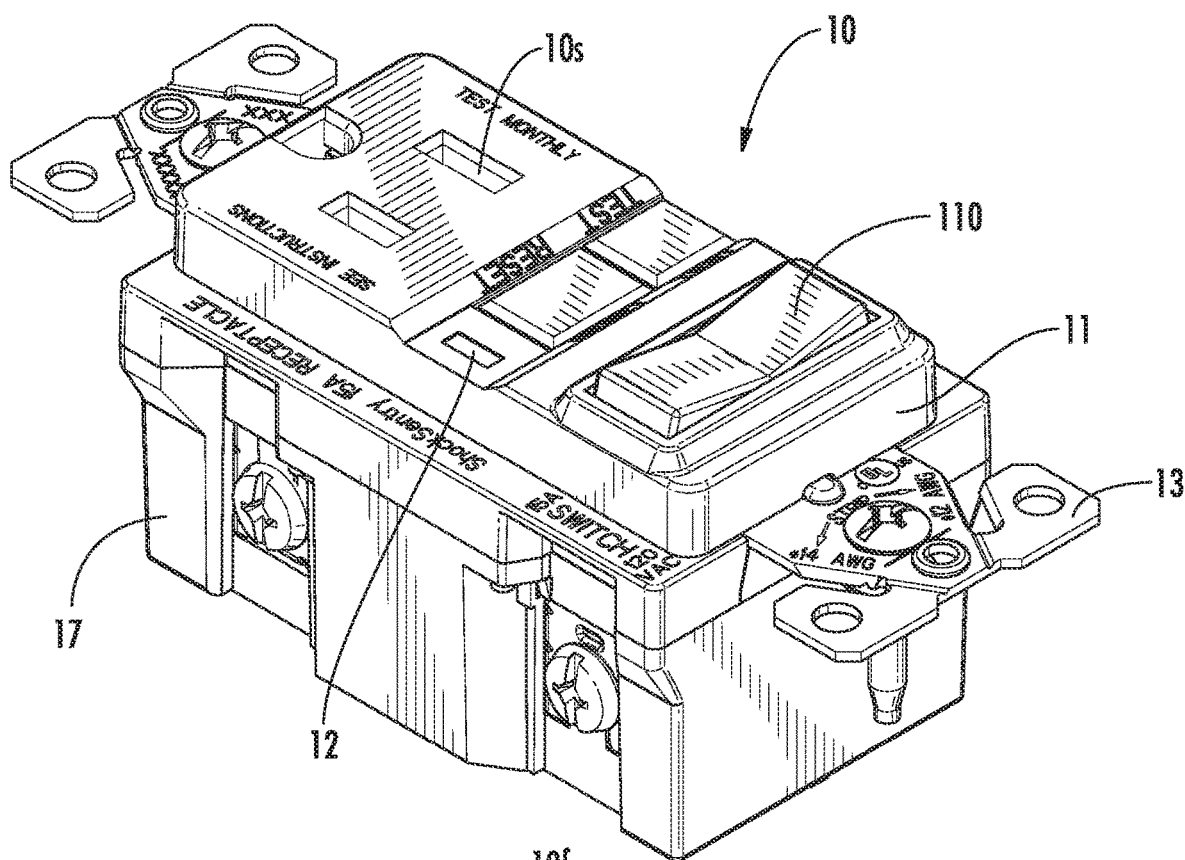
FIG. 20 is a front perspective view of a unit with a single receptacle and an external switch according to embodiments of the present invention.
Figure 21:
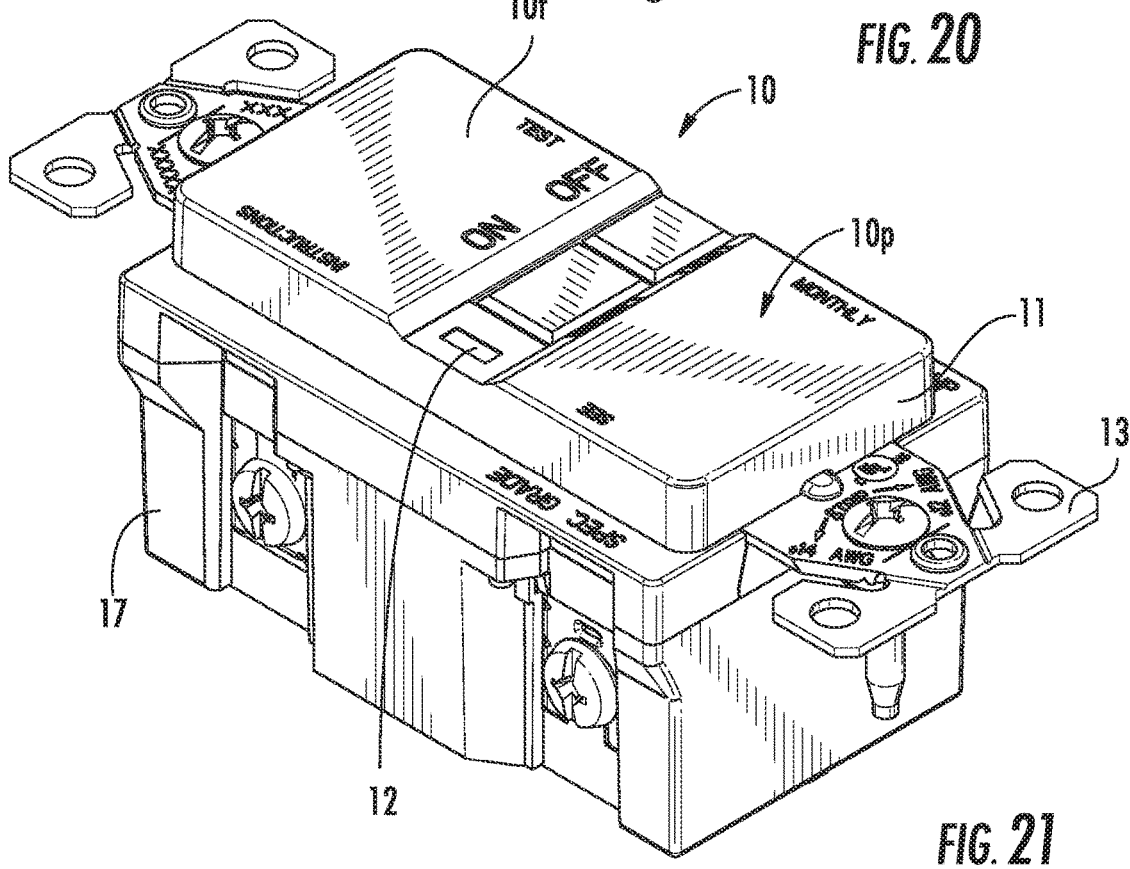
FIG. 21 is a front perspective view of a unit with a dead front panel that does not include receptacles according to embodiments of the present invention.

Although shown as for use with a unit 10 having at least one plug-in receptacle 10s, the unit 10 may be configured for other AFCI and/or GFCI applications so that the unit 10 with the circuit interruption device and trip monitoring circuit 100 and/or wiring error circuit 101 can alternatively or additionally hold an externally accessible user-switch for turning on and off a light source connected to the AFCI or GFCI circuit. For example, as shown in FIG. 20, a unit 10 can be a GFCI and/or AFCI receptacle unit with an external user-actuatable switch 110: on the face of this unit 10, there is one switch 110 and one receptacle 10s (instead of two adjacent receptacles as shown in FIG. 1). The switch 110 can be used as a simple switch or it can be wired to get GFCI (or AFCI) protection. FIG. 22 illustrates another unit 10 with a "dead-front" panel 10p: the face 10f of this GFCI and/or AFCI unit 10 has a closed outer surface with only TEST and RESET buttons and does not include electrical receptacles 10s.

The trip monitoring circuit 100 can include at least one power limiting resistor 52 between the load hot input and the opto-isolator 50. The trip monitoring circuit 100 may include at least one pull-up resistor 54 connected to Vcc and the trip monitoring input 50i of the opto-isolator 50.

As shown in FIG. 4, the opto-isolator 50 can provide a binary output to the micro-controller 60, such as, but not limited to, "high" for a TRIP state and "low" for a RESET state. The reverse logic states may also be used.

Referring to FIG. 5, the opto-coupler 50 can provide the trip monitoring input 50i to the micro-controller 60 and the micro-controller 60 determines if the output is high or not (block 70). If yes (block 75) a light output (e.g., LED) is turned ON (TRIP/S1 OPEN) and an audible alarm can be turned ON. If the output is not high (RESET/S1 CLOSED), the light output (e.g., LED) is OFF (or on green) and if any alarm is used it is also OFF. Again, the reverse binary logic states may be used.

As shown in FIG. 6, the trip monitoring circuit 100 can be configured to open/close the circuit via at least one switch 66. The term "switch" is used broadly to refer to any circuit breaker and includes a relay/contact S1 separating the line side voltage from the load side of the receptacle unit 10. A power supply 65 can be connected to both line hot 15h and line neutral 15n.

The opto-coupler 50 can be a 4-pin opto-coupler U1 and may be in the form of a DIP. The microcontroller 60 can direct the TRIP indicator LED 40 to be ON or OFF as well as the TRIP indicator audible alarm 45 based on the high or low status of the input 50i. Current limiting resistors from microcontroller output terminals, such as R1, R2 can be, in particular embodiments about 2K Ohms. Pull-down resistors R3, R5 (FIG. 15), for example, can be about 10K Ohms. Current limiting resistor 52 from load hot, e.g., resistor R4, can be about 400K Ohms and in some embodiments can be configured as 2×200K for better thermal performance.

The opto-coupler 50 (e.g., U1, FIG. 6) can be a single channel opto-coupler with at least 1.5 KV isolation to comply with current United Laboratory (UL) guidelines. A suitable opto-coupler (U1) for trip monitoring is from Fairchild Semiconductor, San Jose, Calif., under part number FODM2705R2. A suitable 2-channel opto-coupler 50 (U2) is available from Avago Technologies under part number ACPL-224-500E (Avago Sales Office Americas, San Jose, Calif.).

Figure 7:
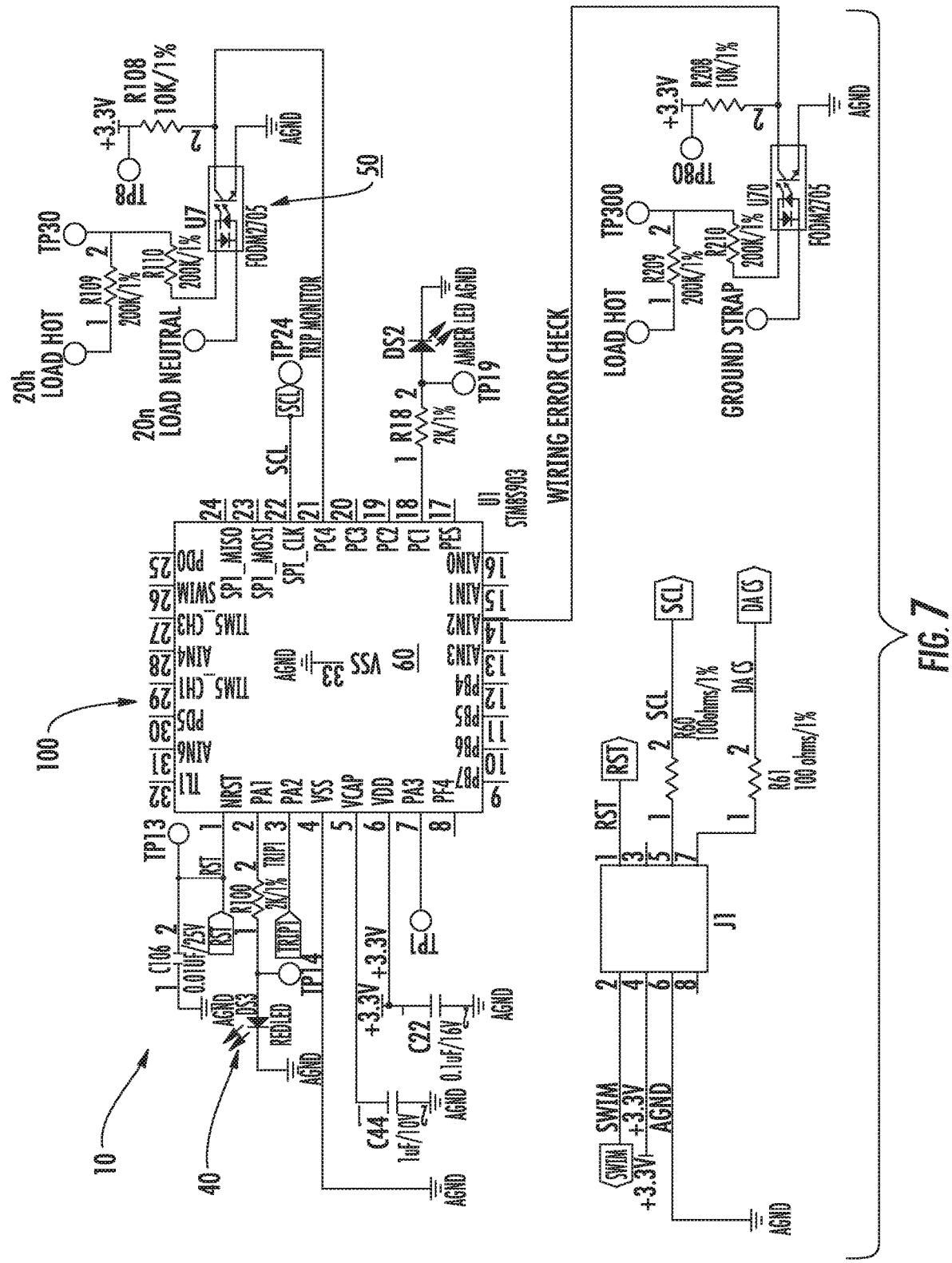
FIG. 7 is a schematic illustration of a microcontroller of an onboard-receptacle monitoring circuit according to embodiments of the present invention.

FIG. 7 is an exemplary trip monitoring circuit 100 for a receptacle unit 10 illustrating one example of a microcontroller 60 and opto-isolator 50 according to some particular embodiments of the invention. However, other micro-controllers and opto-isolators may be used with different configurations.

Figure 8D:
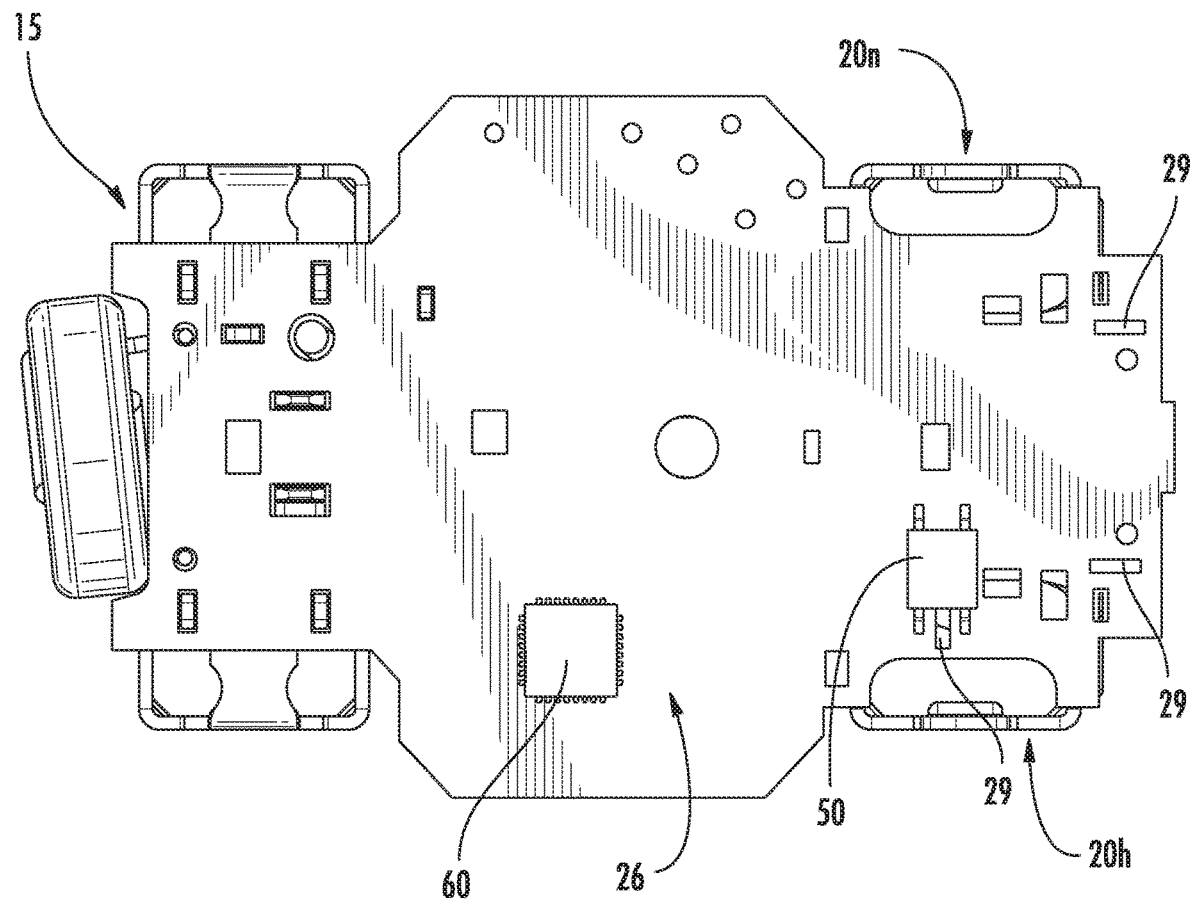
FIG. 8D is a bottom view of the subassembly shown in FIG. 8A.
Figure 9A:
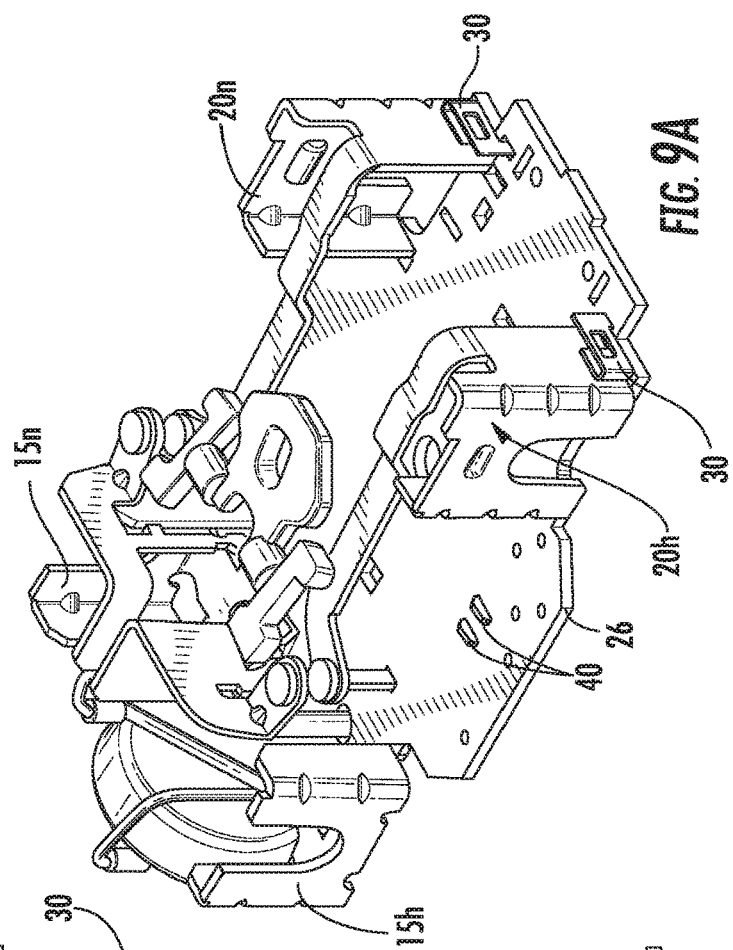
FIG. 9A is a side perspective view of a sub-assembly of a receptacle in a status "ON" or "RESET" position according to embodiments of the present invention.
Figure 9C:
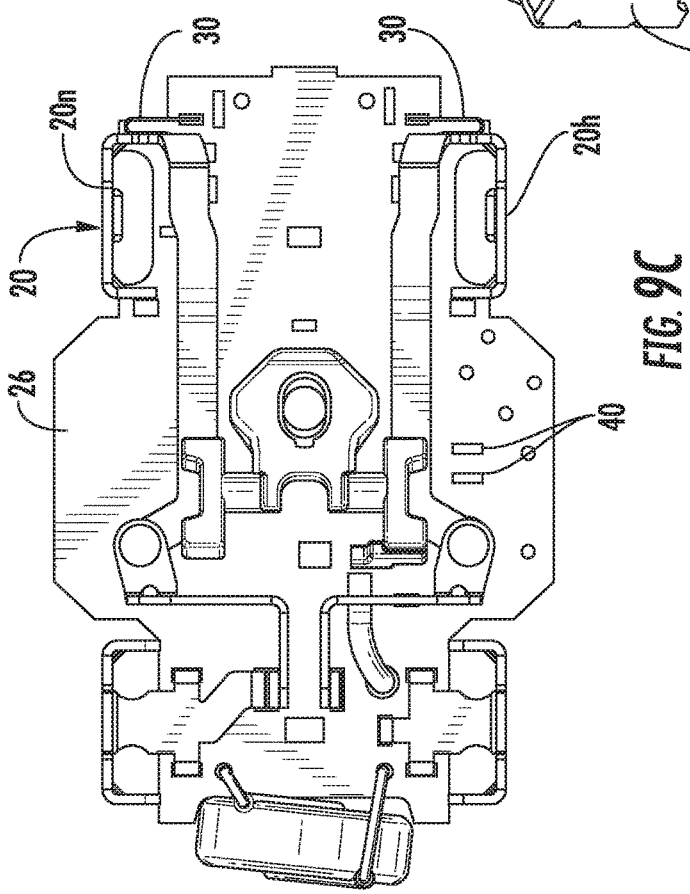
FIG. 9C is a top view of the sub-assembly shown in FIG. 9A.
Figure 9B:
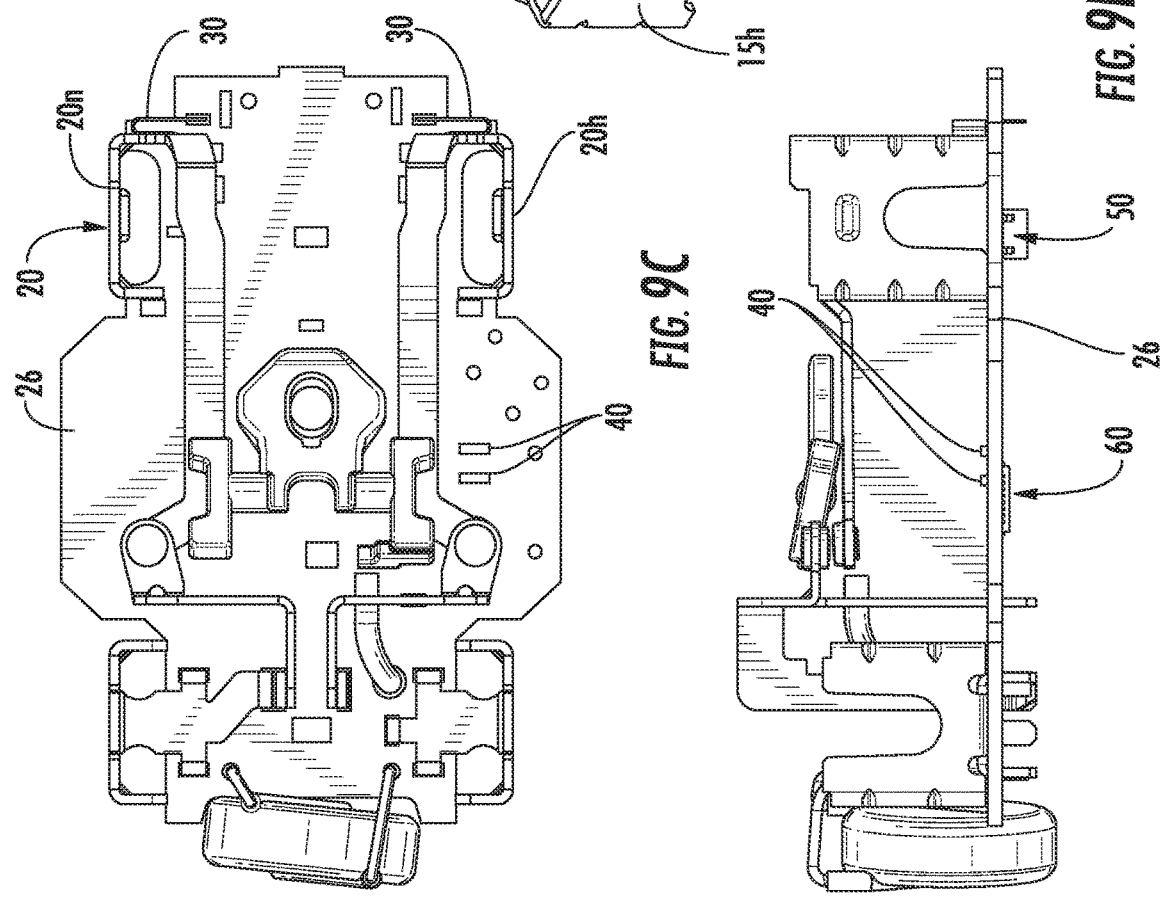
FIG. 9B is a side view of the sub-assembly shown in FIG. 9A.

FIGS. 8A-8C and 9A-9C illustrate a PCB sub-assembly 25 with an exemplary placement of the opto-isolator 50 and microcontroller 60 on the PCB 26. FIGS. 8A-8C illustrates components in an exemplary OFF (TRIP) position while FIGS. 9A-9C illustrate an exemplary ON (RESET) position. The microcontroller 60 and the opto-isolator 50 may reside closer to the hot side of the receptacle unit 10. The sub-assembly 25 can also include adjacent first and second LEDs 40 on the PCB 26 as shown in FIGS. 8A, 9A and 8C, 9C. The load contacts 30 can include legs 31 that extend below the bottom of the PCB 26 as shown in FIGS. 8B, 9B and 8D. The PCB 26 can include isolation apertures 29 including first and second ones that are adjacent the load contact receiving apertures 32 and one or more between adjacent pins/terminals of the opto-isolator 50. Each load contact receiving aperture 32 receives a leg 31 of the load contact 30, 30' in the PCB 26 as shown in FIGS. 8A, 8C and 9A, 9C. The isolation apertures 29 may be rectangular as shown or have other shapes. The isolation apertures 29 can reside between the solenoid 34 (FIG. 2) and the load contact apertures 32.

Figure 10B:
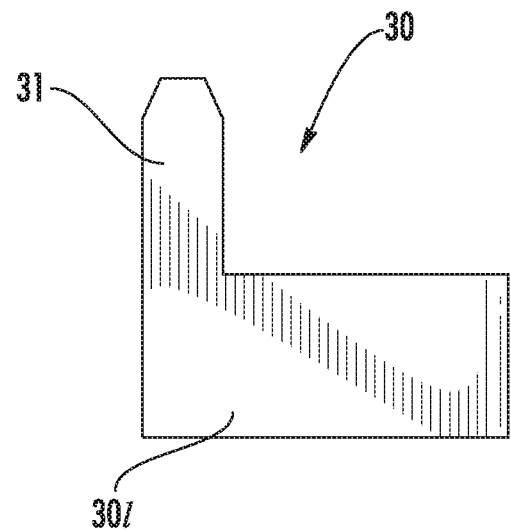
FIG. 10B is a side view of the member shown in FIG. 10A.
Figure 10A:
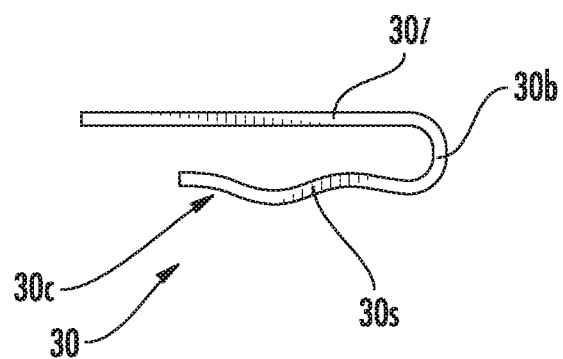
FIG. 10A is a top view of an exemplary load contact member according to embodiments of the present invention.
Figure 11B:
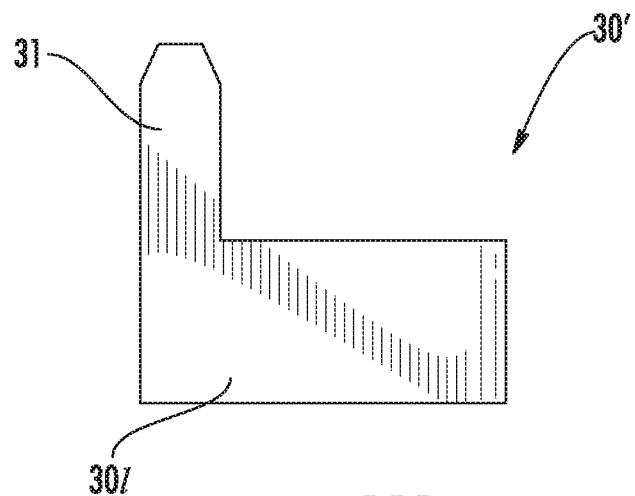
FIG. 11B is a side view of the member shown in FIG. 11A.
Figure 11A:
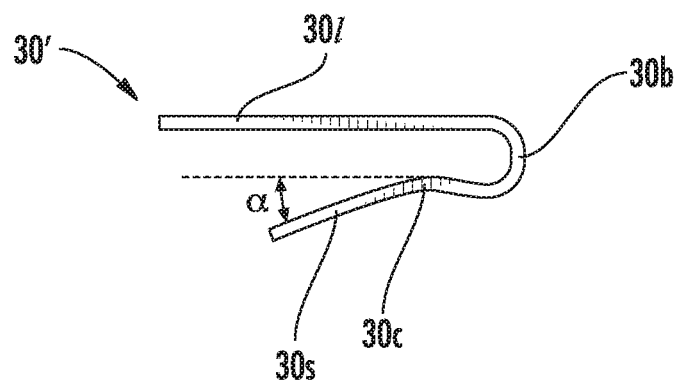
FIG. 11A is a top view of another exemplary load contact member according to embodiments of the present invention.

FIGS. 10A, 10B and 11A, 11B illustrate exemplary load contacts 30, 30'. As shown in FIGS. 10A and 11A, the load contact member 30, 30' has a downwardly extending leg 31 (e.g., tab or prong) and a first, typically longer, side 30l that merges into a bend 30b that turns to form a second, typically shorter, side 30s. The second side 30s can have a curvilinear or wave shape 30c. The second side 30s may be longer or have the same length as the long side. The first and second sides 30l, 30s can be parallel and oriented to be perpendicular to the plane of the primary surface of the PCB 26.

The first and second sides 301, 30s can define a gap therebetween of about 0.030 inches. The load contact members 30, 30' can be spring load-contact members and may comprise phosphor bronze.

FIGS. 10A and 10B illustrate a curvilinear undulating shape 30c of the shorter side 30s. FIGS. 11A and 11B illustrate a curvilinear shape with a radial bend outward to end in a tip segment 30t that angles away from the long side at an angle "a" of between 30-60 degrees relative to a line drawn parallel with a segment closest to the long side as the end juts out. Other load contact member type, shapes and materials may be used.

The legs 31 of each load contact 30, 30' can be soldered to the PCB 26 to electrically connect to the opto-isolator 50.

The phosphor bronze material can comprise material C52100, tempered H08, spring hard, with a tensile strength between 110-120 KPSI, a yield strength 106 KPSI, an elongation (% per 2 inches) of about 6%, a Rockwell hardness (B-scale) of 98-102 and a thickness of 0.008+/−0.0003. While the neutral and hot side load contacts 30, 30' are shown as having the same shape and size, they may have different sizes and shapes.

Figure 12A:
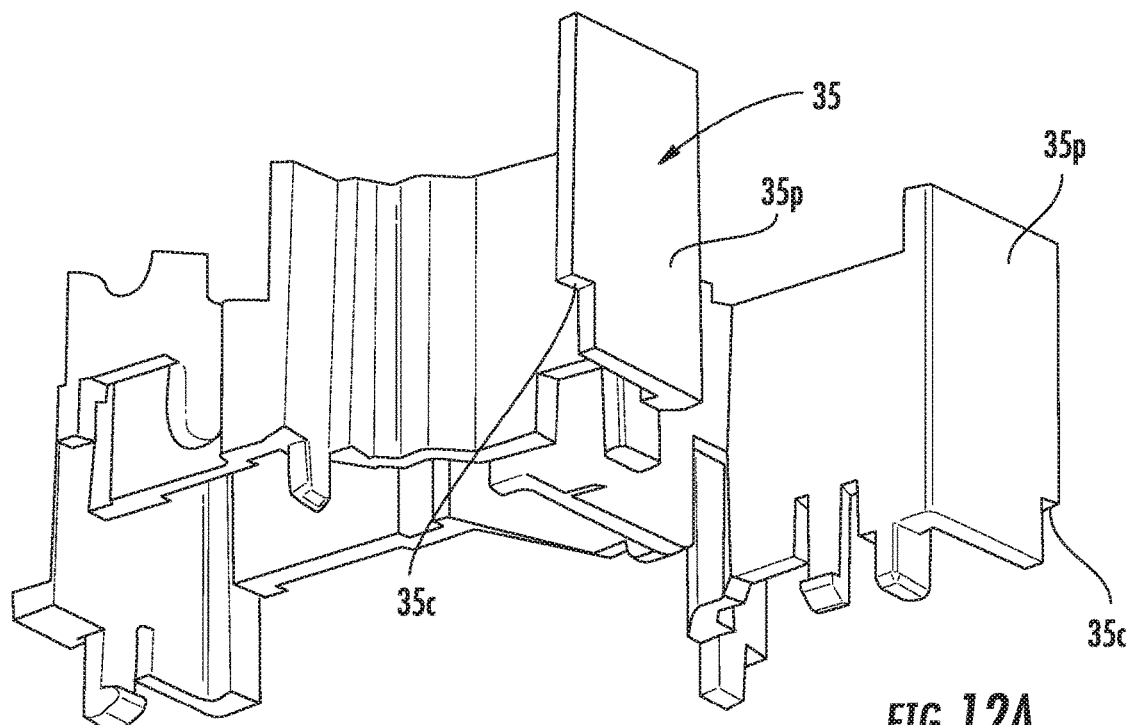
FIG. 12A is a greatly enlarged side perspective view of an exemplary solenoid housing of the receptacle according to some embodiments of the present invention.
Figure 12B:
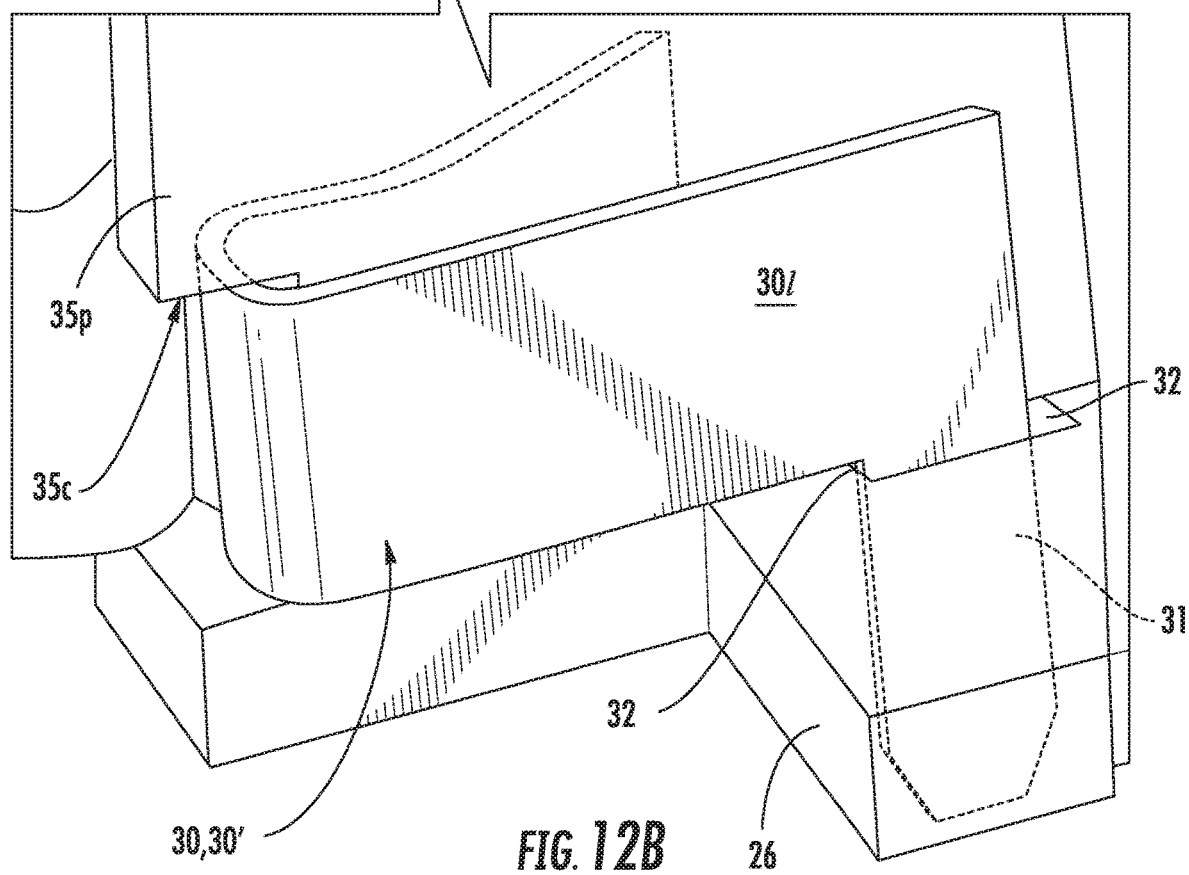
FIG. 12B is a greatly enlarged partial assembly view of a receptacle showing the solenoid housing of FIG. 12A connected to the load contact member and printed circuit board according to some embodiments of the present invention.

In some particular embodiments, as shown in FIGS. 12A and 12B, the solenoid housing 35 can include front downwardly extending panels 35p with outer corner notches 35c with a height corresponding to a height dimension of the load contact member 30, 30'. FIG. 12B illustrates that the load contact member 30, 30' sits on the upper surface of the PCB 26 with the leg 31 extending through the aperture 32 and with the upper edge of the load contact member 30, 30' trapped between the corner of the panel 35c and the upper surface of the PCB so that the second side of the load contact member 30s resides against a back side of the panel 35p.

Figure 13:
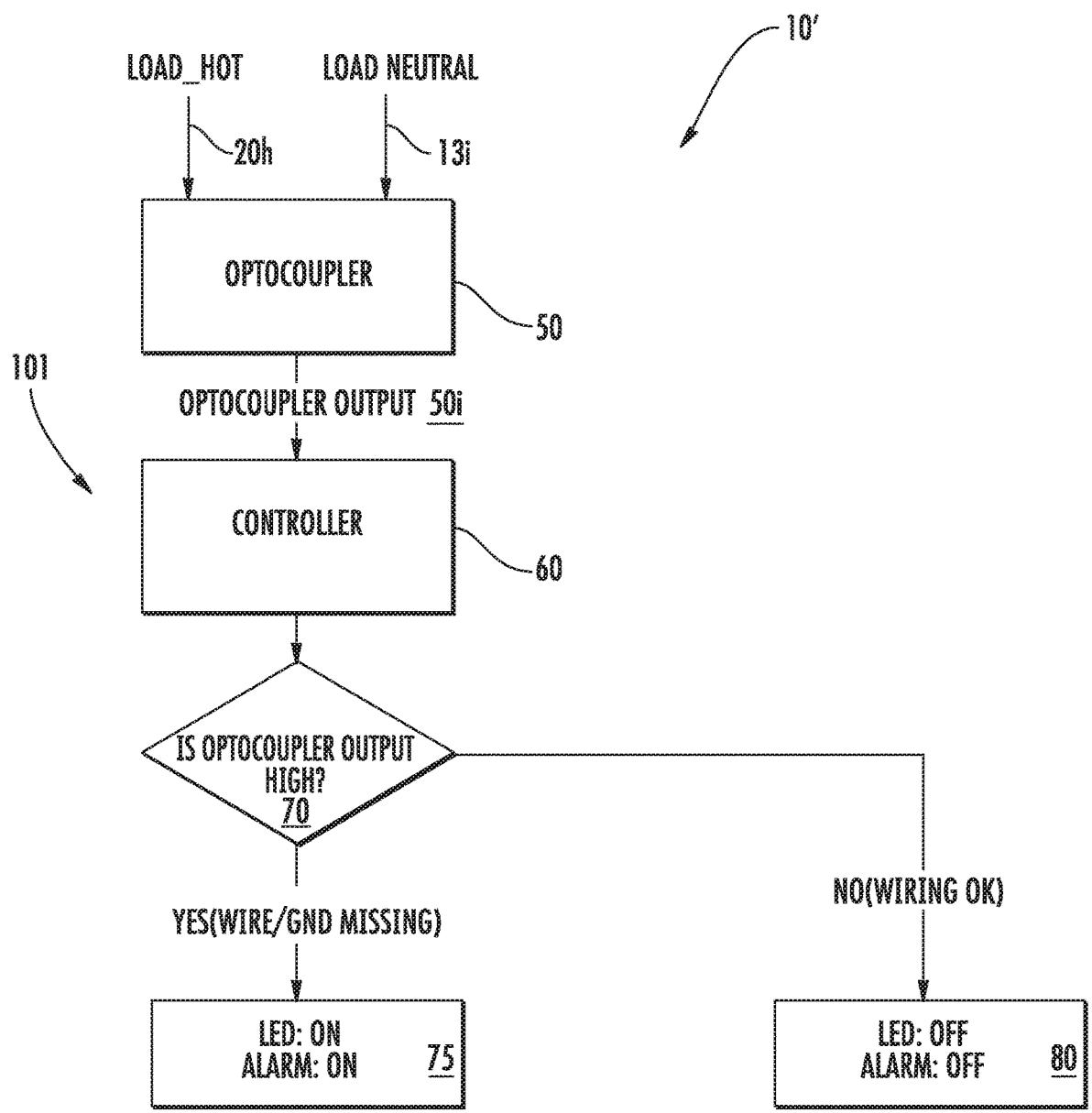
FIG. 13 is a flow chart of an exemplary onboard electronic wiring error detection circuit according to embodiments of the present invention.

FIG. 13 illustrates that the receptacle 10' can alternatively or additionally have an onboard wiring error monitoring circuit 101. This circuit 101 uses a hot load input 20h and a ground strap input 13i into the opto-isolator 50. The opto-isolator input 50i to the microcontroller 60 is used as a wiring error monitoring and/or detection circuit 101. Similar to the embodiment discussed with FIG. 5, the opto-coupler 50 can provide the monitoring input 50i to the micro-controller 60 and the micro-controller 60 determines if the output is high or not (block 70). If yes (block 75) a light output (e.g., LED) is turned ON (WIRE ERROR/GROUND MISSING) and an audible alarm can be turned ON. If the output is not high (WIRING CORRECT), the light output (e.g., LED) is OFF (or on Green) and if any alarm, it is also OFF. Reverse logic states can be used, e.g., high can mean normal and low can mean error.

Figure 14:
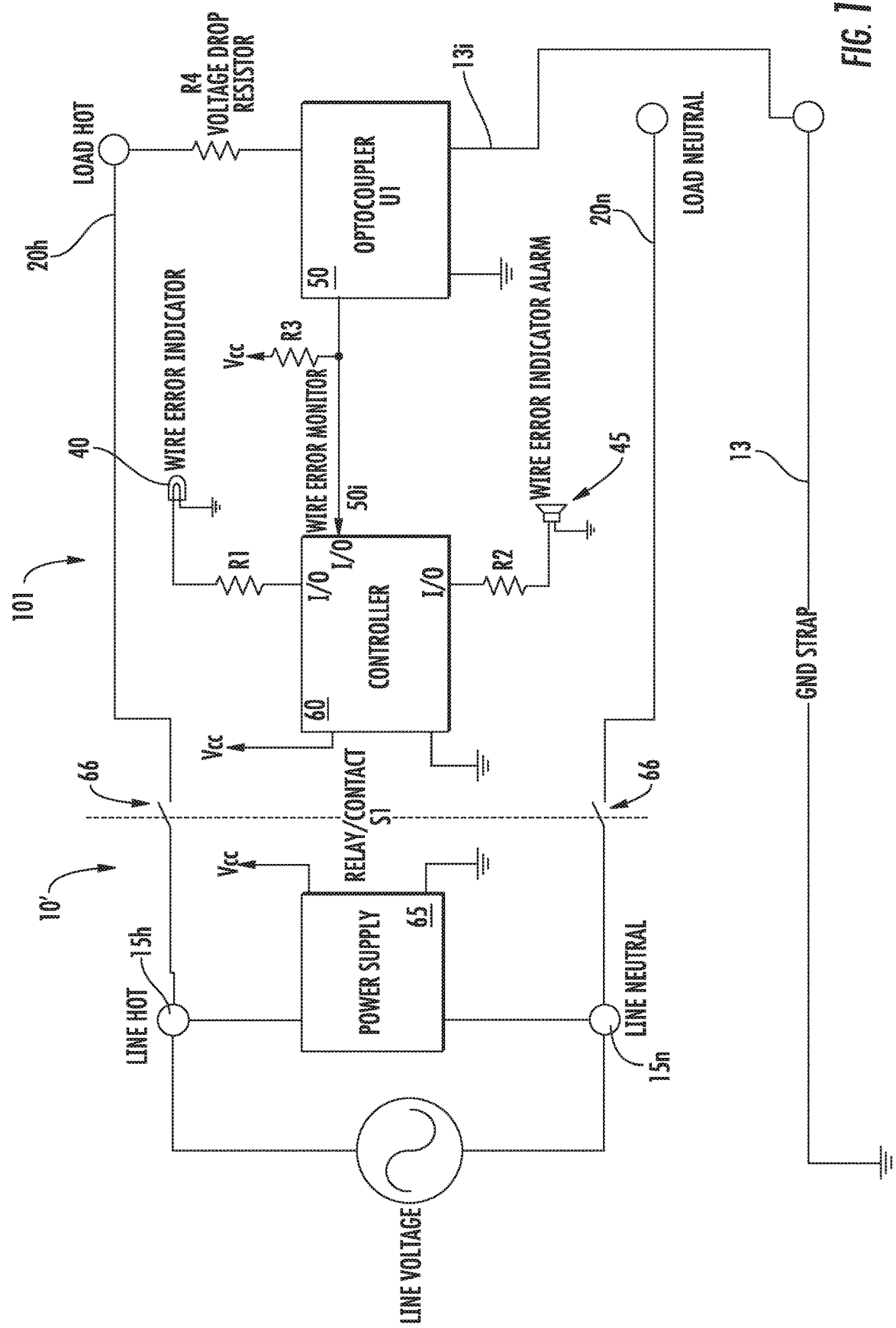
FIG. 14 is a schematic illustration of a wiring error detection circuit according to embodiments of the present invention.

FIG. 14 is a schematic illustration of the wire error monitoring and/or detection circuit 101 which includes the opto-coupler 50 and microcontroller 60 discussed above with the ground strap input 13i into the opto-coupler 50.

This circuit 101 works based on the fact that GROUND is tied to 'NEUTRAL' back at a breaker panel. So, if the GROUND connection is missing or if the HOT and NEUTRAL are wired backwards, this circuit 101 can detect it and let the micro-controller 60 know. Thus, the monitoring circuit 101 can detect if the GROUND connection is not made to the Ground strap of the receptacle. The micro-controller 60 can then take appropriate action (TRIP the receptacle, turn an LED ON, generate an audible alarm and the like).

Figure 15:
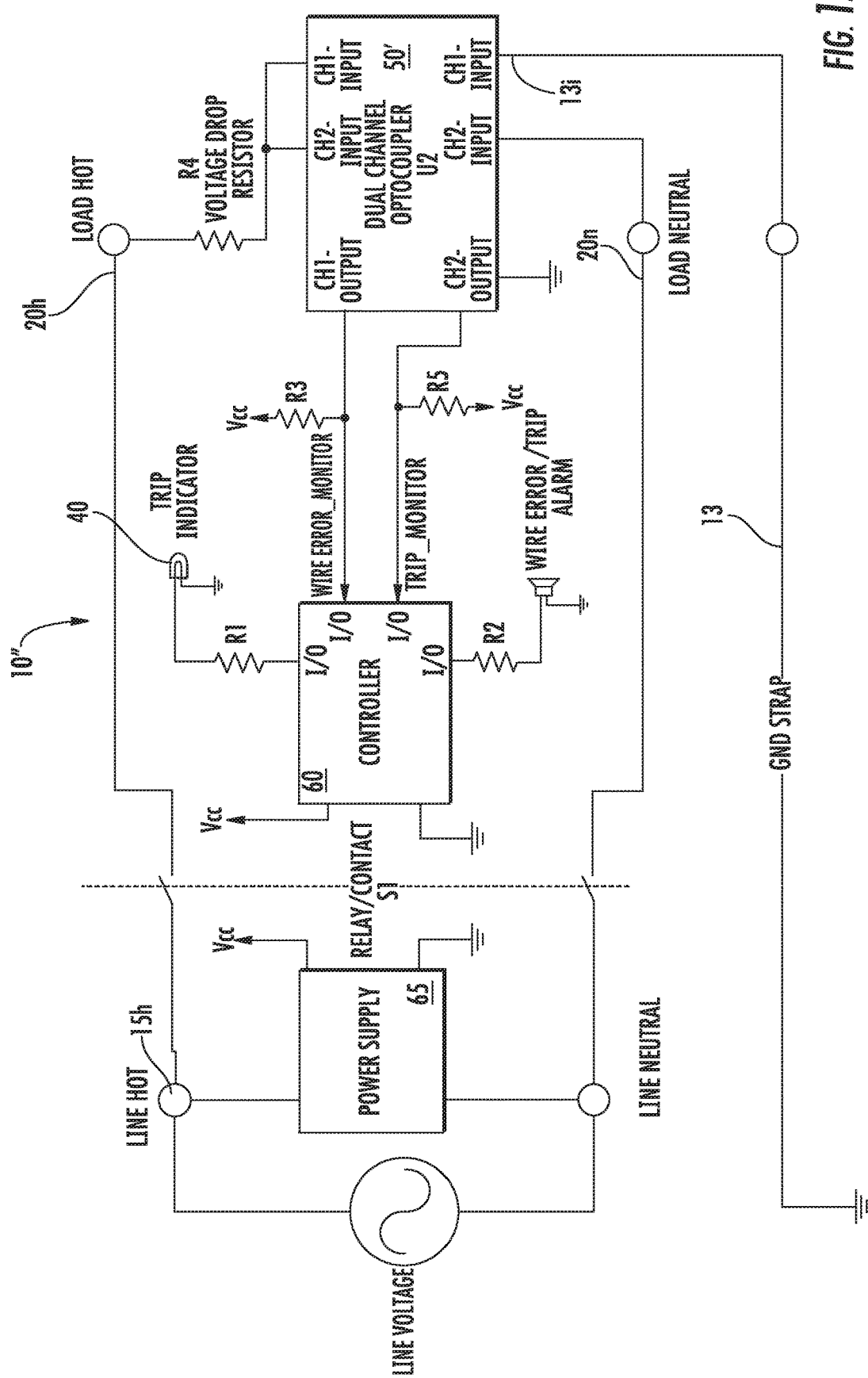
FIG. 15 is a schematic illustration of a trip wire and wiring error circuit according to embodiments of the present invention.

FIG. 15 illustrates a receptacle unit 10" with an onboard TRIP and wire error monitoring/detection circuit 100' which includes the circuits 100 and 101. In this embodiment, a dual channel opto-isolator 50' can be used and the load hot input 20h can be to two different channels while load neutral is connected to one channel and the ground strap input 13i to the other to provide two binary outputs to the microcontroller 60, one for the wire error monitoring and one for the TRIP monitoring.

Figure 16:
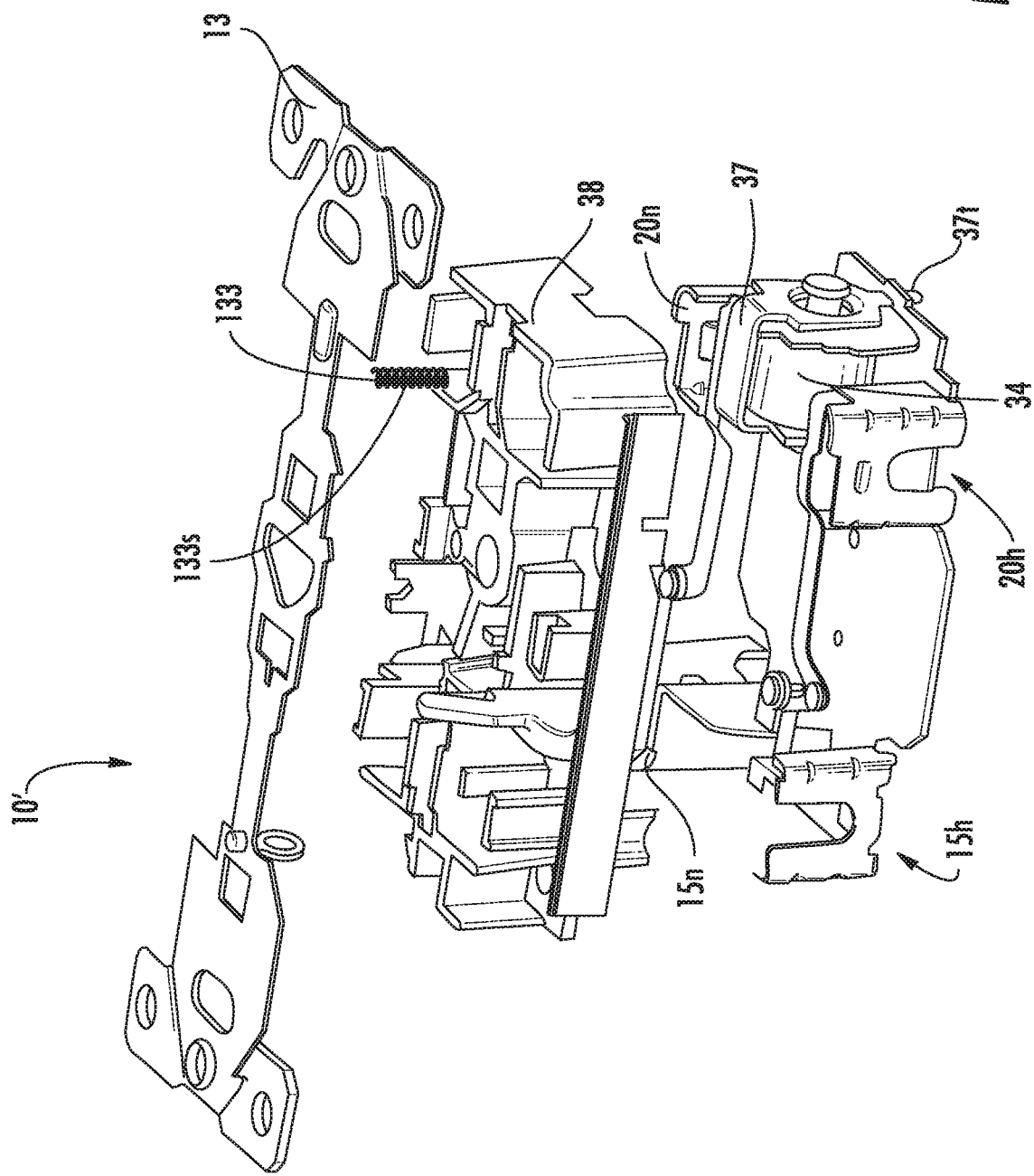
FIG. 16 is a partial exploded view of a receptacle with an onboard wiring error electronic monitoring circuit according to embodiments of the present invention.
Figure 17:
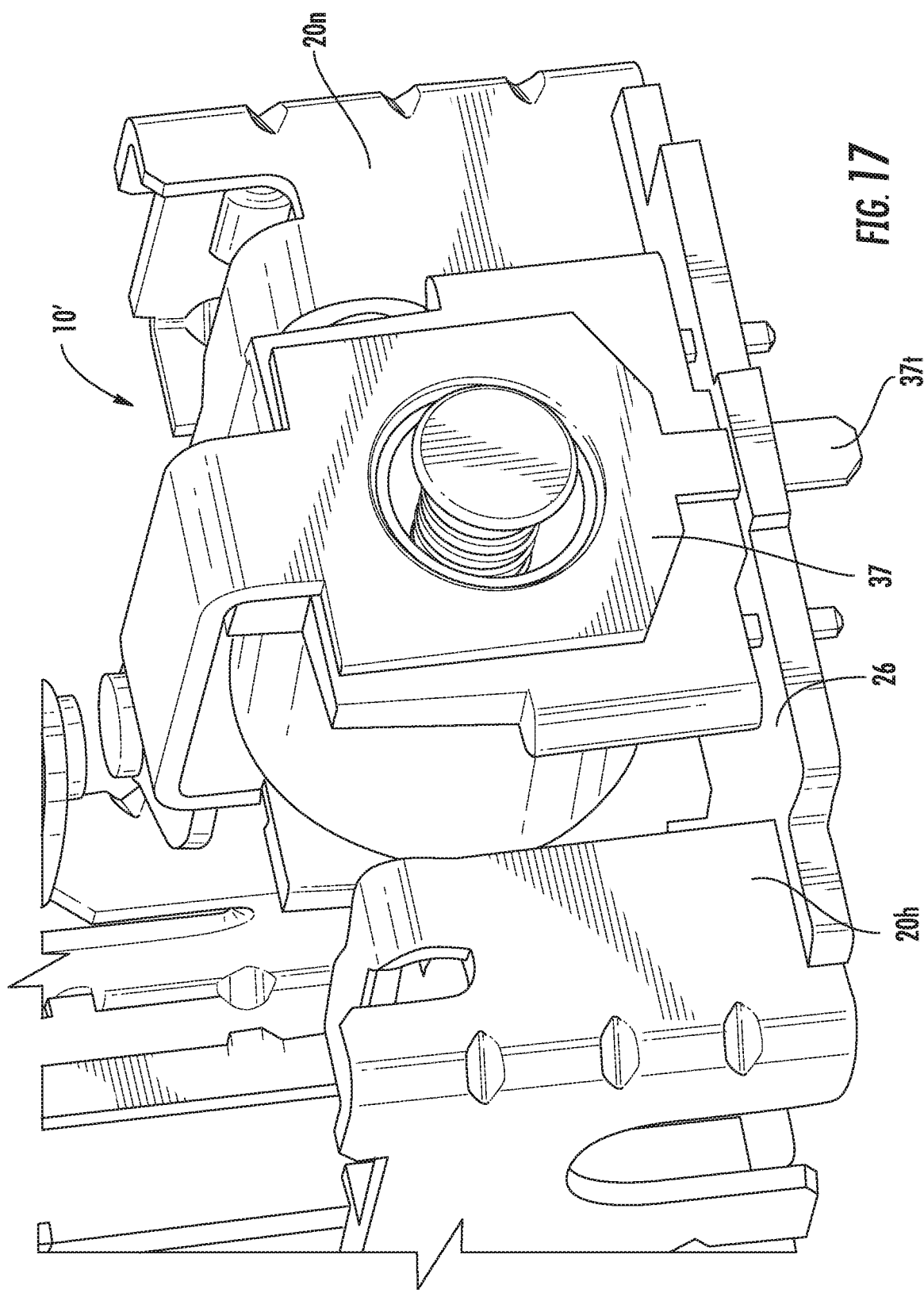
FIG. 17 is a greatly enlarged view of a portion of the receptacle shown in FIG. 16 illustrating a ground contact of a solenoid frame to the printed circuit board according to embodiments of the present invention.
Figure 18:
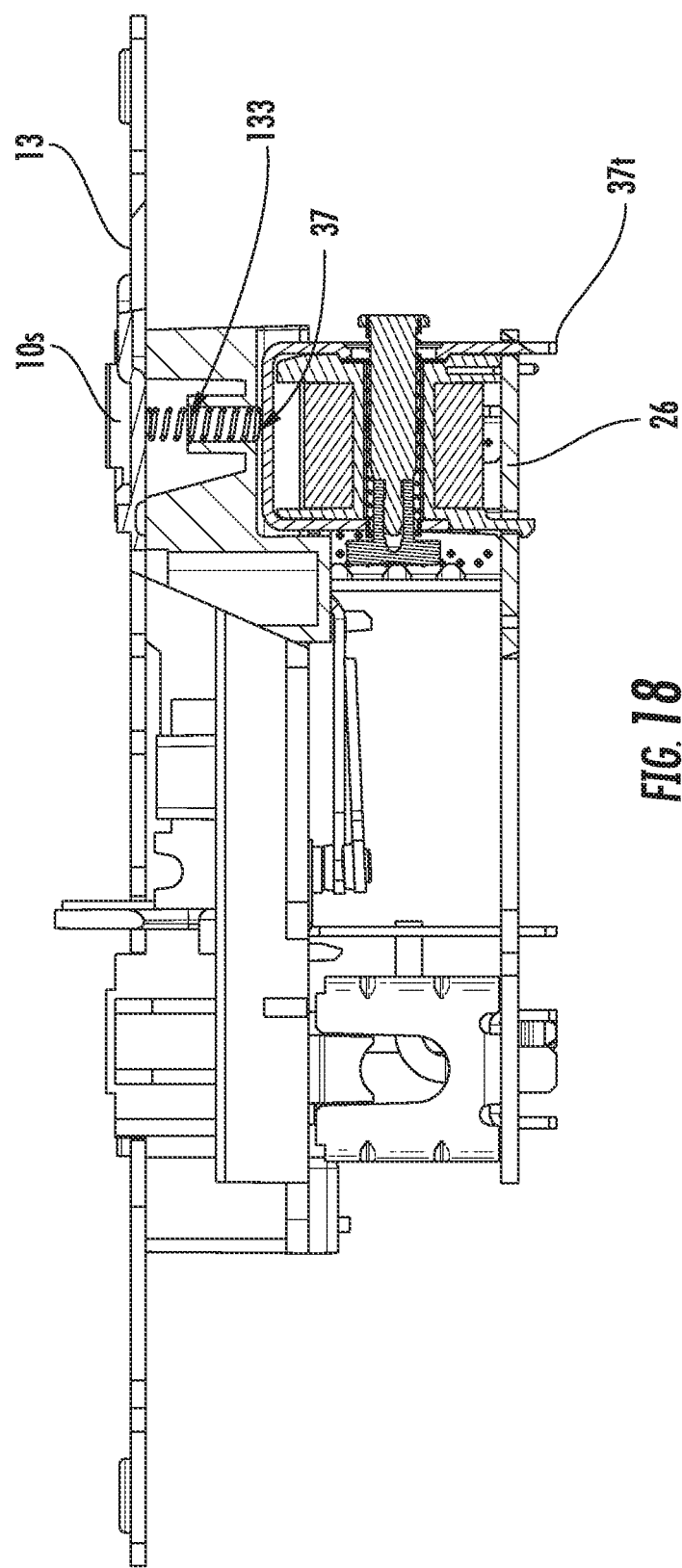
FIG. 18 is a side assembled view of the receptacle shown in FIG. 16 illustrating the ground strap electrically connected to the printed circuit board for ground input to the opto-coupler per the circuit shown in FIGS. 14 and/or 15.

FIGS. 16-18 illustrate an example of a ground strap 13 electrical pathway to the PCB 26 for the input 13i to the opto-isolator 50. In some embodiments, a conductive downwardly extending ground strap contact member 133 is held between and is electrically connected to the ground strap 13 and the metal solenoid frame 37. The contact member 133 can extend through the middle housing 38. The contact member 133 may comprise a spring or spring component 133s, shown as a coil spring but other resilient flexible or even rigid couplings may be used. The solenoid frame 37 can include a metal or other conductive tab 37t that provides the ground strap input 13i to the PCB 26 and the opto-isolator 50. The metal frame around the solenoid 37 is typically part of solenoid mechanical assembly. The tab 37t on the metal frame can be soldered to the PCB 26.

Figure 19:
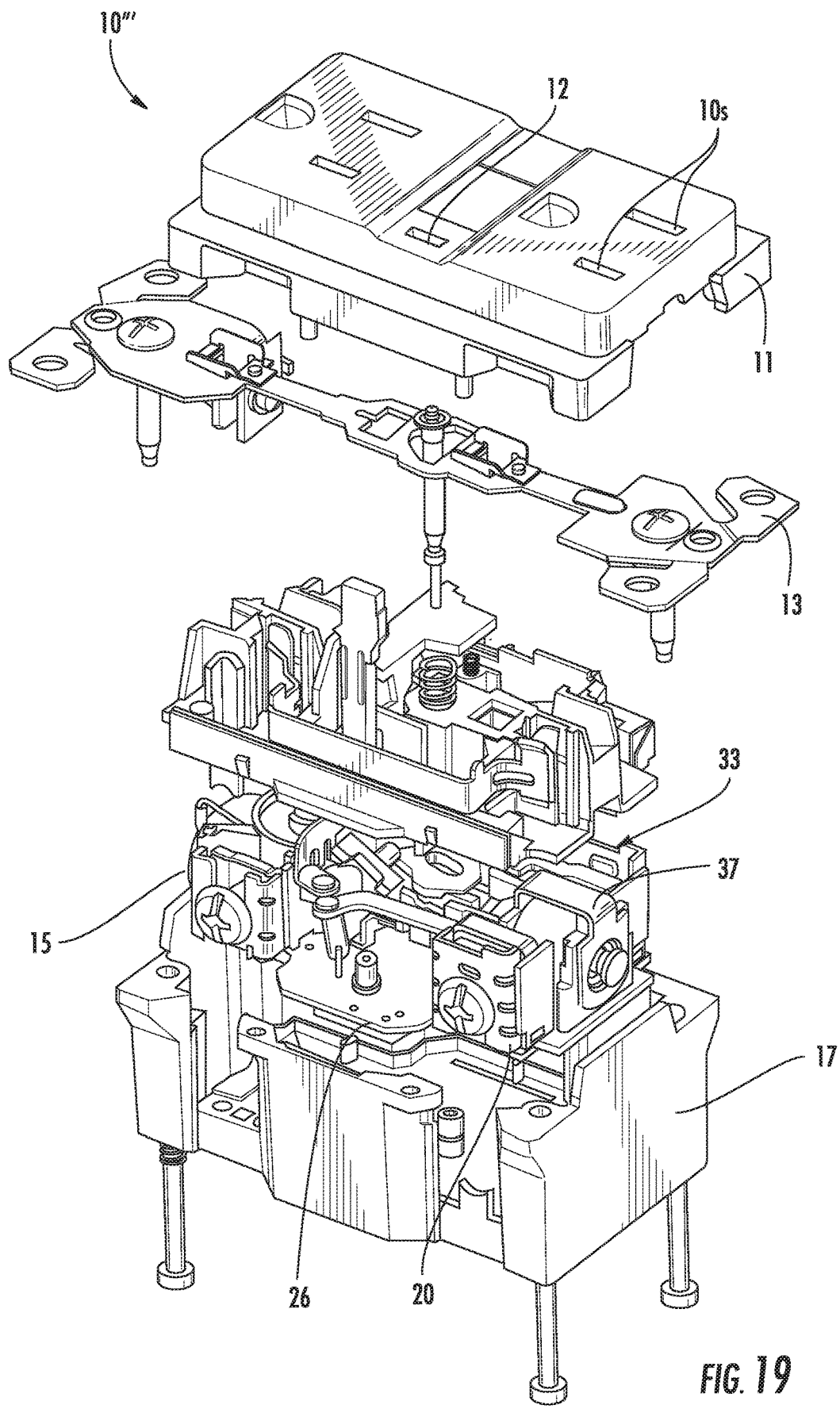
FIG. 19 is a partial exploded view of a ground fault current interrupter receptacle according to embodiments of the present invention.

FIG. 19 illustrates a GFCI receptacle unit 10''' which can be modified to include the onboard monitoring circuits 100 or 101 or both 100 and 101 as discussed above.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. An Arc Fault Circuit Interrupter (AFCI) unit and/or a Ground Fault Circuit Interrupter (GFCI) unit, comprising:
   a unit housing with a ground strap, the unit housing having line and load sides, the load side having hot and neutral branches;
   a circuit interruption device in the unit housing configured to detect a fault and to interrupt power to the load side;
   an opto-isolator in electrical communication with the hot and neutral branches; and
   a controller in electrical communication with the opto-isolator in the unit housing, wherein the controller monitors the opto-isolator to identify a TRIP or RESET state of the unit,
   wherein the opto-isolator is configured to provide one of two binary output alternatives to the controller that the controller uses to identify the TRIP or RESET state of the unit, and wherein one of the two binary output alternatives is 0 volts.

2. The unit of claim 1, further comprising either (a) a voltage drop resistor of about 400K Ohms coupled to the hot branch and an input of the opto-isolator or (b) first and second voltage drop resistors of about 200K Ohms, arranged in series and coupled to the hot branch and an input of the opto-isolator, wherein the unit comprises at least one receptacle, and wherein the ground strap is coupled to the at least one receptacle and the at least one receptacle has the line and load sides.

3. The unit of claim 1, further comprising:
a printed circuit board (PCB) that holds the controller and the opto-isolator and a plurality of light emitting diodes in communication with the controller;
a first load contact member that connects the load side hot branch to the PCB; and
a second spaced apart load contact member that connects the load side neutral branch to the PCB.

4. An Arc Fault Circuit Interrupter (AFCI) unit and/or a Ground Fault Circuit Interrupter (GFCI) unit, comprising:
a unit housing with a ground strap, the unit housing having line and load sides, the load side having hot and neutral branches;
a circuit interruption device in the unit housing configured to detect a fault and to interrupt power to the load side;
an opto-isolator in electrical communication with the hot and neutral branches;
a controller in electrical communication with the opto-isolator in the unit housing, wherein the controller monitors the opto-isolator to identify a TRIP or RESET state of the unit;
a printed circuit board (PCB) that holds the controller and the opto-isolator;
a first load contact member that connects the load side hot branch to the PCB;
a second spaced apart load contact member that connects the load side neutral branch to the PCB; and
isolation apertures extending through the PCB residing between adjacent pins of the opto-isolator and the first and second load contact members.

5. The unit of claim 3, wherein the first and second load contact members have a leg that extends under a spring body, the spring body having first and second sides, one side of the spring body being planar and the other being curvilinear, prior to assembly.

6. The unit of claim 5, further comprising first and second flat panels held in the unit housing, each having an outer perimeter with a notch, wherein each load contact member resides in a respective notch over the PCB with the first side of the spring body on one side of a corresponding flat panel and with the second side of the spring body on an opposing side.

7. An Arc Fault Circuit Interrupter (AFCI) unit and/or a Ground Fault Circuit Interrupter (GFCI) unit, comprising:
a unit housing with a ground strap held by the unit housing, the unit housing having line and load sides, the load side having hot and neutral branches;
a circuit interruption device in the unit housing configured to detect a fault and to interrupt power to the load side;
an opto-isolator in electrical communication with the hot branch of the load side and the ground strap;
a controller in electrical communication with the opto-isolator in the unit housing, wherein the controller monitors the opto-isolator to identify a wiring error;
a printed circuit board (PCB) that holds the controller and the opto-isolator and a plurality of light emitting diodes in communication with the controller;
a load contact member that connects the load side hot branch to the PCB; and
a ground strap contact member residing under the ground strap and in electrical communication with a solenoid frame over the PCB, wherein the solenoid frame comprises a tab that extends through the PCB to provide a ground strap input to the opto-isolator.

8. The unit of claim 7, wherein the unit comprises at least one receptacle, and wherein the ground strap is coupled to at least one of the at least one receptacle and the at least one receptacle has the line and load sides.

9. An Arc Fault Circuit Interrupter (AFCI) unit and/or a Ground Fault Circuit Interrupter (GFCI) unit, comprising:
a unit housing with a ground strap held by the unit housing, the unit housing having line and load sides, the load side having hot and neutral branches;
a circuit interruption device in the unit housing configured to detect a fault and to interrupt power to the load side;
an opto-isolator in electrical communication with the hot branch of the load side and the ground strap;
a controller in electrical communication with the opto-isolator in the unit housing, wherein the controller monitors the opto-isolator to identify a wiring error;
a printed circuit board (PCB) that holds the controller and the opto-isolator and at least one light emitting diode in communication with the controller; and
isolation apertures extending through the PCB residing between adjacent pins of the opto-isolator and a load contact member.

10. The unit of claim 9, further comprising:
a load contact member that connects the load side hot branch to the PCB; and
a spring ground strap contact member residing under the ground strap and in electrical communication with a solenoid frame over the PCB, wherein the solenoid frame comprises a tab that extends through the PCB to provide a ground strap input to the opto-isolator.

11. The receptacle unit of claim 10, wherein the load contact member has a leg that extends under a spring body, the spring body having first and second sides, one side of the spring body being planar and the other being curvilinear, prior to assembly.

12. The receptacle unit of claim 11, further comprising a housing in the unit housing comprising a flat panel having an outer perimeter with a notch, wherein the load contact member resides in the notch over the PCB with the first side of the spring body on one side of the flat panel and with the second side of the spring body on an opposing side.

13. An Arc Fault Circuit Interrupter (AFCI) receptacle unit and/or a Ground Fault Circuit Interrupter (GFCI) unit, comprising:
a unit housing with a ground strap held by the unit housing, the unit housing having line and load sides, the load side having hot and neutral branches;
a circuit interruption device in the unit housing configured to detect a fault and to interrupt power to the load side;
an opto-isolator in electrical communication with the hot and neutral branches and the ground strap;
a controller in electrical communication with the opto-isolator in the unit housing, wherein the controller monitors the opto-isolator to identify (a) a wiring error associated with the receptacle and (b) a TRIP or RESET state of the unit a printed circuit board (PCB) that holds the controller and the opto-isolator and at least one light emitting diode in communication with the controller;
a first load contact member that connects the load side hot branch to the PCB; and
a second spaced apart load contact member that connects the load side neutral branch to the PCB,
wherein the PCB comprises isolation apertures extending through the PCB residing between adjacent pins of the opto-isolator and the first and second load contact members.

14. The unit of claim 13, wherein the unit comprises at least one receptacle, and wherein the ground strap is coupled to the at least one receptacle and the at least one receptacle has the line and load sides.

15. The unit of claim 13, wherein the first and second load contact members have a leg that extends under a spring body, the spring body having first and second sides, one side of the spring body being planar and the other being curvilinear, prior to assembly.

16. The unit of claim 15, further comprising a housing in the unit housing comprising first and second flat panels, each having an outer perimeter with a notch, wherein each load contact member resides in a respective notch over the PCB with the first side of the spring body on one side of a corresponding flat panel and with the second side of the spring body on an opposing side.

17. An Arc Fault Circuit Interrupter (AFCI) receptacle unit and/or a Ground Fault Circuit Interrupter (GFCI) unit, comprising:
 a unit housing with a ground strap held by the unit housing, the unit housing having line and load sides, the load side having hot and neutral branches;
 a circuit interruption device in the unit housing configured to detect a fault and to interrupt power to the load side;
 an opto-isolator in electrical communication with the hot and neutral branches and the ground strap;
 a controller in electrical communication with the opto-isolator in the unit housing, wherein the controller monitors the opto-isolator to identify (a) a wiring error associated with the receptacle and (b) a TRIP or RESET state of the unit;
 a printed circuit board (PCB) that holds the controller and the opto-isolator and at least one light emitting diode in communication with the controller;
 a first load contact member that connects the load side hot branch to the PCB;
 a second load contact member that connects the load side neutral branch to the PCB; and
 a ground strap contact member residing under the ground strap and in electrical communication with a conductive solenoid frame over the PCB, wherein the solenoid frame comprises a conductive tab that extends through the PCB to provide a ground strap input to the opto-isolator.

18. The unit of claim 17, wherein the ground strap contact member is configured as a conductive spring ground strap contact member.

19. An Arc Fault Circuit Interrupter (AFCI) unit and/or a Ground Fault Circuit Interrupter (GFCI) unit, comprising:
 a unit housing with a ground strap held by the unit housing, the unit housing having line and load sides, the load side having hot and neutral branches;
 a circuit interruption device in the unit housing configured to detect a fault and to interrupt power to the load side;
 an opto-isolator in electrical communication with the hot branch of the load side and the ground strap; and
 a controller in electrical communication with the opto-isolator in the unit housing, wherein the controller monitors the opto-isolator to identify a wiring error;
 wherein the unit comprises at least one voltage drop resistor of about 200K Ohms coupled to the hot branch of the load side and to an input of the opto-isolator.

20. An Arc Fault Circuit Interrupter (AFCI) receptacle unit and/or a Ground Fault Circuit Interrupter (GFCI) unit, comprising:
 a unit housing with a ground strap held by the unit housing, the unit housing having line and load sides, the load side having hot and neutral branches;
 a circuit interruption device in the unit housing configured to detect a fault and to interrupt power to the load side;
 an opto-isolator in electrical communication with the hot and neutral branches and the ground strap; and
 a controller in electrical communication with the opto-isolator in the unit housing, wherein the controller monitors the opto-isolator to identify (a) a wiring error associated with the receptacle and (b) a TRIP or RESET state of the unit;
 wherein the opto-isolator is configured to provide one of two binary output alternatives to the controller at any one time that the controller uses to identify the TRIP or RESET state of the unit, and wherein one of the two binary output alternatives is 0 volts.

21. An Arc Fault Circuit Interrupter (AFCI) unit and/or a Ground Fault Circuit Interrupter (GFCI) unit, comprising:
 a unit housing unit with a ground strap, the unit housing having line and load sides, the load side having hot and neutral branches;
 a circuit interruption device in the unit housing configured to detect a fault and to interrupt power to the load side;
 an optocoupler in electrical communication with the hot and neutral branches; and
 a controller in electrical communication with the opto-coupler in the unit housing, wherein the controller monitors the optocoupler to identify a TRIP or RESET state of the unit,
 wherein the optocoupler is a multiple channel optocoupler comprising first and second channels, each providing respective first and second outputs to separate ports of the controller, wherein the first and second channels are each electrically coupled to the hot branch as a respective first input, wherein the first channel has a second input that is electrically coupled to the ground strap, wherein the second channel has a second input that is electrically coupled to the neutral branch, wherein the controller monitors the first output from the first channel to determine if there is a wiring error, and wherein the controller monitors the second output from the second channel to identify the TRIP or RESET state.

22. The unit of claim 21, further comprising at least one voltage drop resistor that is coupled to the hot branch and to an input of the optocoupler.

23. An Arc Fault Circuit Interrupter (AFCI) unit comprising:
 a unit housing having line and load sides, the load side having hot and neutral branches;
 a circuit interruption device in the unit housing configured to detect a fault and to interrupt power to the load side;
 an optocoupler in electrical communication with the hot and neutral branches of the load side; and
 a controller in electrical communication with the opto-coupler in the unit housing, wherein the controller monitors an output of the optocoupler to identify a TRIP or RESET state of the AFCI unit,
 wherein the optocoupler provides a single output from two binary output alternatives to the controller to identify the TRIP or RESET state, and wherein one of the two binary output alternatives is 0 volts.

24. An Arc Fault Circuit Interrupter (AFCI) unit comprising:
 a unit housing having line and load sides, the load side having hot and neutral branches;

a circuit interruption device in the unit housing configured to detect a fault and to interrupt power to the load side;

an optocoupler in electrical communication with the hot and neutral branches of the load side;

a controller in electrical communication with the optocoupler in the unit housing, wherein the controller monitors an output of the optocoupler to identify a TRIP or RESET state of the AFCI unit; and at least one voltage drop resistor of about 200K Ohms coupled to the hot branch and an input of the optocoupler.

25. The AFCI unit of claim 23, further comprising first and second resistors, each of about 200,000 Ohms arranged in series that are coupled to the hot branch of the load side and to an input of the optocoupler.

26. The AFCI unit of claim 23, wherein the optocoupler is further electrically coupled to a ground strap, and wherein the controller monitors an output of the optocoupler to identify a wiring error associated with a receptacle.

27. An Arc Fault Circuit Interrupter (AFCI) unit comprising:

a unit housing having line and load sides, the load side having hot and neutral branches;

a circuit interruption device in the unit housing configured to detect a fault and to interrupt power to the load side;

an optocoupler in electrical communication with the hot and neutral branches of the load side; and a controller in electrical communication with the optocoupler in the unit housing, wherein the controller monitors an output of the optocoupler to identify a TRIP or RESET state of the AFCI unit, wherein the optocoupler is a first optocoupler, wherein the AFCI unit further comprises a second optocoupler electrically coupled to the hot branch of the load side and to a ground strap, wherein the controller monitors an output of the second optocoupler to identify a wiring error associated with a receptacle.

* * * * *

UNITED STATES PATENT AND TRADEMARK OFFICE
CERTIFICATE OF CORRECTION

PATENT NO. : 10,855,067 B2
APPLICATION NO. : 15/560537
DATED : December 1, 2020
INVENTOR(S) : Murahari et al.

Page 1 of 1

It is certified that error appears in the above-identified patent and that said Letters Patent is hereby corrected as shown below:

In the Specification

Column 8, Line 61: Please correct "side 301" to read -- side 30*l* --

Column 8, Line 66: Please correct "sides 301" to read -- sides 30*l* --

Column 9, Line 1: Please correct "sides 301" to read -- sides 30*l* --

Column 9, Line 9: Please correct "angle "a"" to read -- angle "α" --

In the Claims

Column 12, Line 56, Claim 13: Please correct "the unit a printed circuit board" to read
-- the unit;
a printed circuit board --

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*